US009806040B2

(12) United States Patent
Liu et al.

(10) Patent No.: US 9,806,040 B2
(45) Date of Patent: Oct. 31, 2017

(54) ANTENNA IN EMBEDDED WAFER-LEVEL BALL-GRID ARRAY PACKAGE

(71) Applicant: STATS ChipPAC Pte. Ltd., Singapore (SG)

(72) Inventors: Kai Liu, Phoenix, AZ (US); Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/219,098

(22) Filed: Jul. 25, 2016

(65) Prior Publication Data

US 2017/0033062 A1  Feb. 2, 2017

Related U.S. Application Data

(60) Provisional application No. 62/198,522, filed on Jul. 29, 2015.

(51) Int. Cl.
*H01L 27/14* (2006.01)
*H01L 23/66* (2006.01)
(Continued)

(52) U.S. Cl.
CPC ............ *H01L 23/66* (2013.01); *H01L 21/486* (2013.01); *H01L 21/568* (2013.01);
(Continued)

(58) Field of Classification Search
CPC ............... H01L 23/66; H01L 23/49827; H01L 23/5225; H01L 23/528; H01L 23/552;
(Continued)

(56) References Cited

U.S. PATENT DOCUMENTS 8,288,209 B1 * 10/2012 Chi ...................... H01L 21/4832
438/106
8,786,060 B2 * 7/2014 Yen ........................ H01L 23/552
257/660

(Continued)

OTHER PUBLICATIONS

Wojnowski M. et al., "A 77-GHz SiGe Single-Chip Four-Channel Transceiver Module with Integrated Antennas in Embedded Wafer-Level BGA Package", 2012 IEEE 62nd Electronic Components and Technology Conference, pp. 1027-1032, May 2012.

*Primary Examiner* — Yosef Gebreyesus
(74) *Attorney, Agent, or Firm* — Brian M. Kaufman; Robert D. Atkins; Patent Law Group: Atkins and Associates, P.C.

(57) ABSTRACT

A semiconductor device has a semiconductor die and an encapsulant deposited over the semiconductor die. A first conductive layer is formed with an antenna over a first surface of the encapsulant. A second conductive layer is formed with a ground plane over a second surface of the encapsulant with the antenna located within a footprint of the ground plane. A conductive bump is formed on the ground plane. A third conductive layer is formed over the first surface of the encapsulant. A fourth conductive layer is formed over the second surface of the encapsulant. A conductive via is disposed adjacent to the semiconductor die prior to depositing the encapsulant. The antenna is coupled to the semiconductor die through the conductive via. The antenna is formed with the conductive via between the antenna and semiconductor die. A PCB unit is disposed in the encapsulant.

25 Claims, 21 Drawing Sheets

(51) Int. Cl.
*H01L 23/498* (2006.01)
*H01L 23/00* (2006.01)
*H01L 23/528* (2006.01)
*H01L 23/522* (2006.01)
*H01L 21/56* (2006.01)
*H01L 21/48* (2006.01)
*H01L 23/552* (2006.01)

(52) U.S. Cl.
CPC .. *H01L 23/49816* (2013.01); *H01L 23/49827* (2013.01); *H01L 23/49838* (2013.01); *H01L 23/528* (2013.01); *H01L 23/5225* (2013.01); *H01L 23/552* (2013.01); *H01L 24/19* (2013.01); *H01L 24/20* (2013.01); *H01L 24/96* (2013.01); *H01L 24/97* (2013.01); *H01L 2223/6677* (2013.01); *H01L 2224/04105* (2013.01); *H01L 2224/12105* (2013.01); *H01L 2224/19* (2013.01); *H01L 2224/24227* (2013.01); *H01L 2224/32225* (2013.01); *H01L 2224/73267* (2013.01); *H01L 2224/92244* (2013.01); *H01L 2224/94* (2013.01); *H01L 2224/97* (2013.01); *H01L 2924/15311* (2013.01); *H01L 2924/3025* (2013.01)

(58) Field of Classification Search
CPC ......... H01L 24/19; H01L 24/20; H01L 24/96; H01L 24/97; H01L 2223/6677; H01L 2224/04105; H01L 2224/12105; H01L 2224/24227; H01L 2224/32225; H01L 2224/73267; H01L 2224/83005; H01L 2224/92244; H01L 2224/94; H01L 2224/97; H01L 21/486; H01L 21/568; H01L 2924/15311; H01L 2924/3025
See application file for complete search history.

(56) References Cited

U.S. PATENT DOCUMENTS

| | | | |
|---|---|---|---|
| 8,890,319 B2* | 11/2014 | Sapone | H01L 21/568 257/734 |
| 9,318,449 B2* | 4/2016 | Hasch | H01L 23/66 |
| 2005/0052924 A1* | 3/2005 | Nishizawa | G06K 19/077 713/310 |
| 2009/0236031 A1* | 9/2009 | Sunohara | H01L 21/4857 156/182 |
| 2014/0252573 A1* | 9/2014 | Lin | H01L 24/19 257/666 |

* cited by examiner

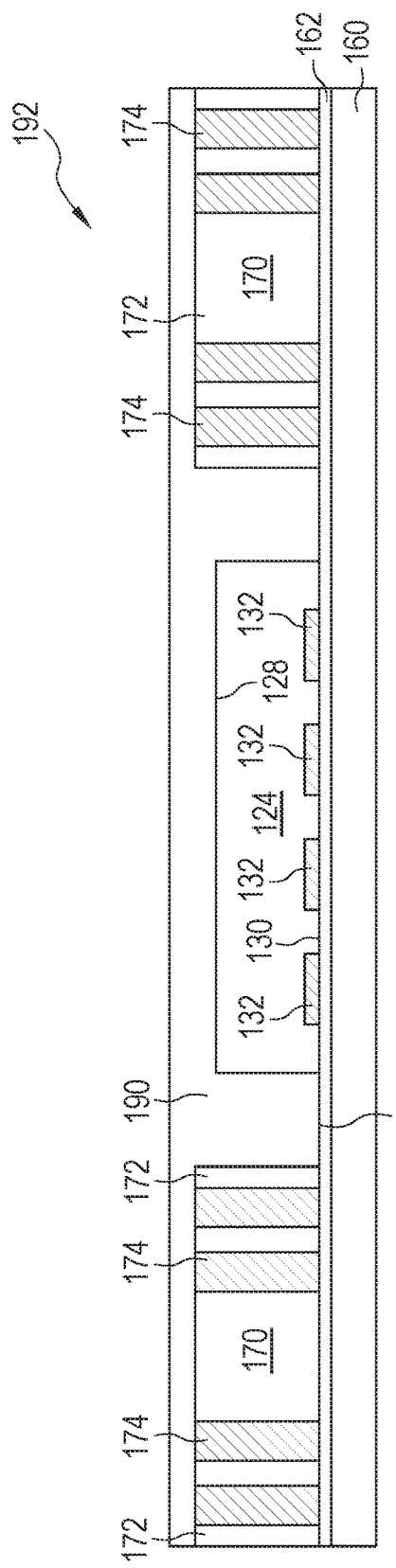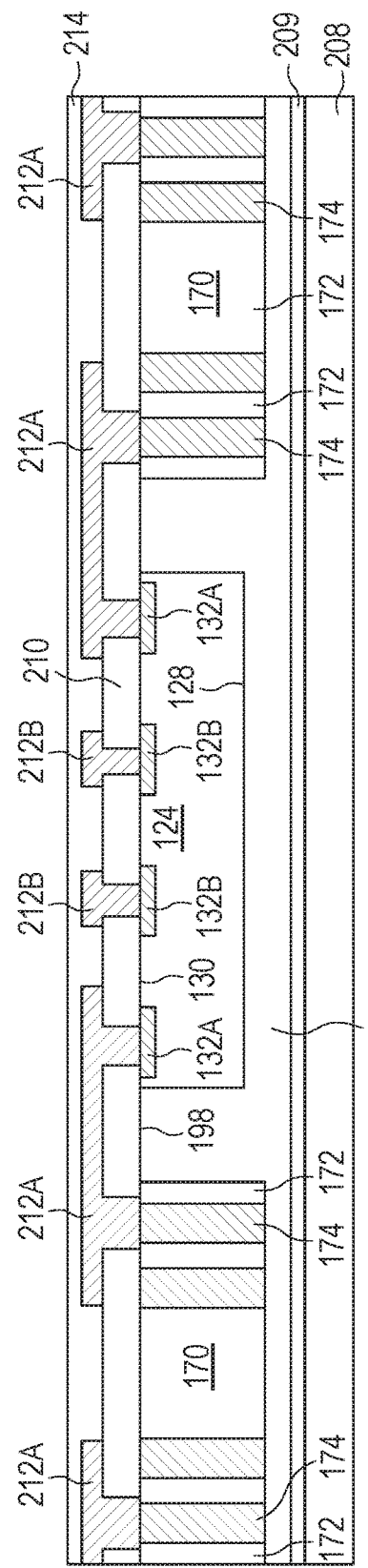

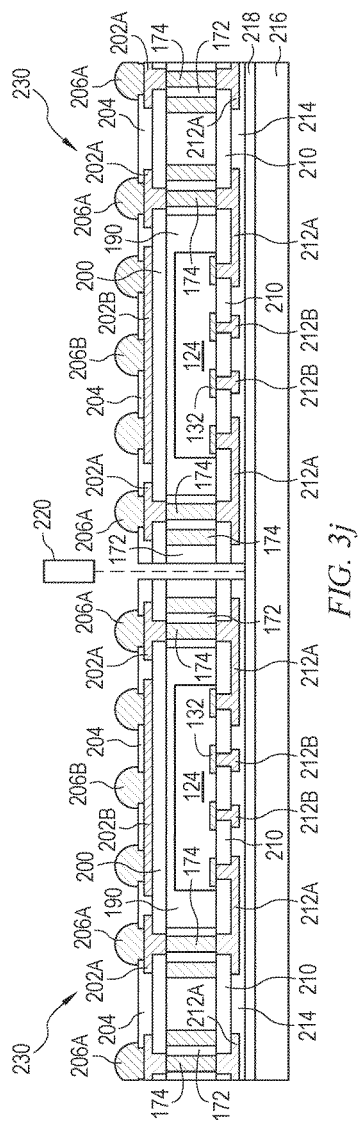
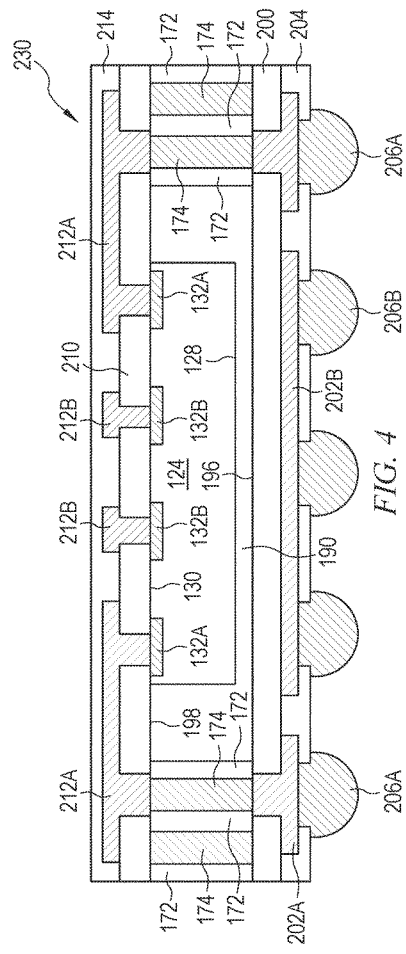
FIG. 3j
FIG. 4

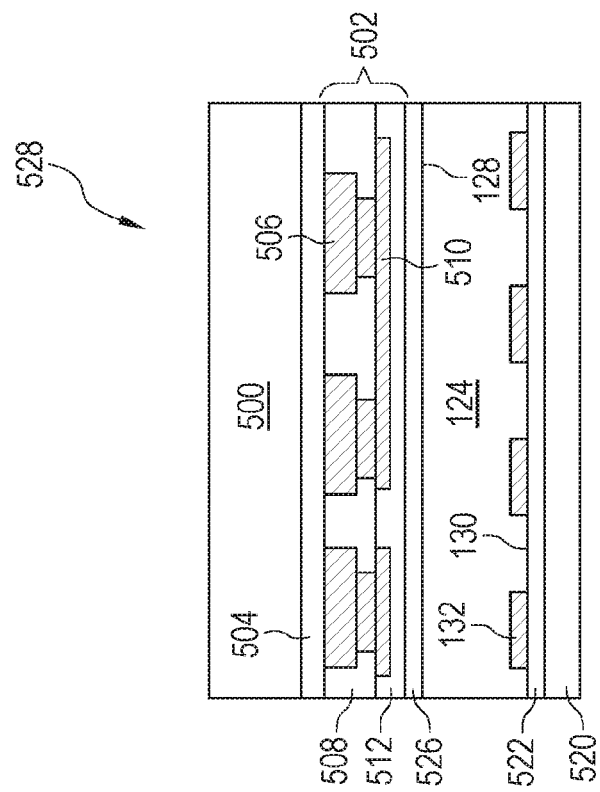
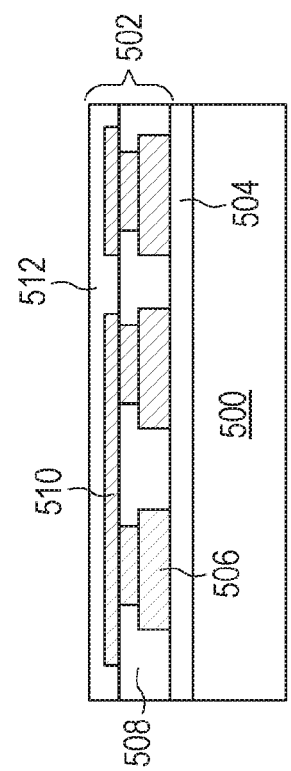
FIG. 8b
FIG. 8a

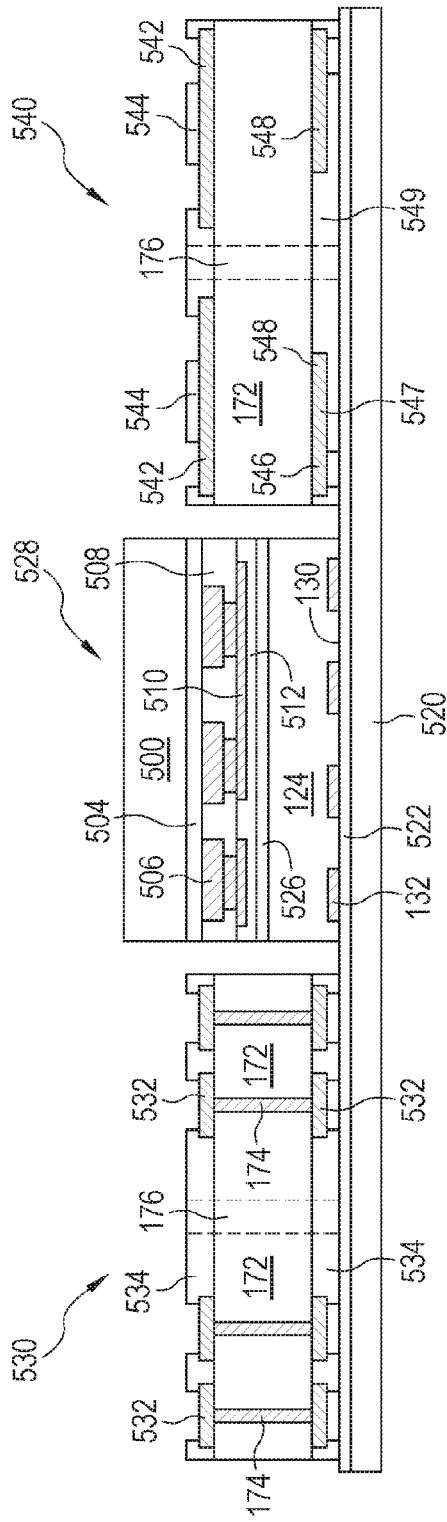
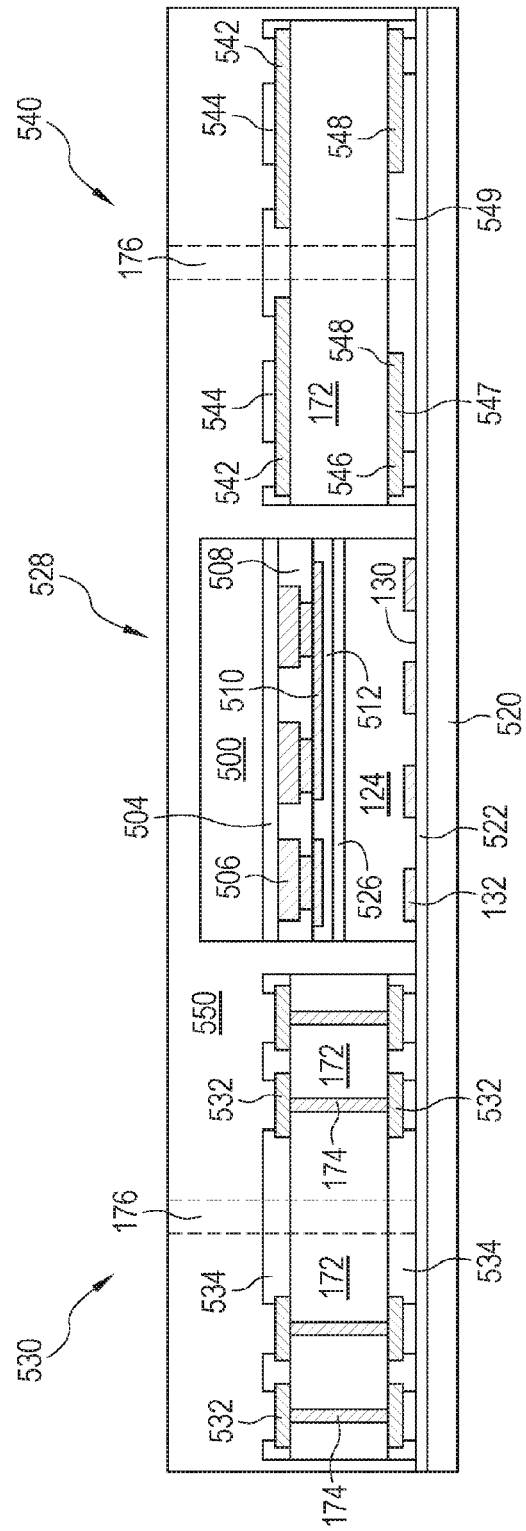

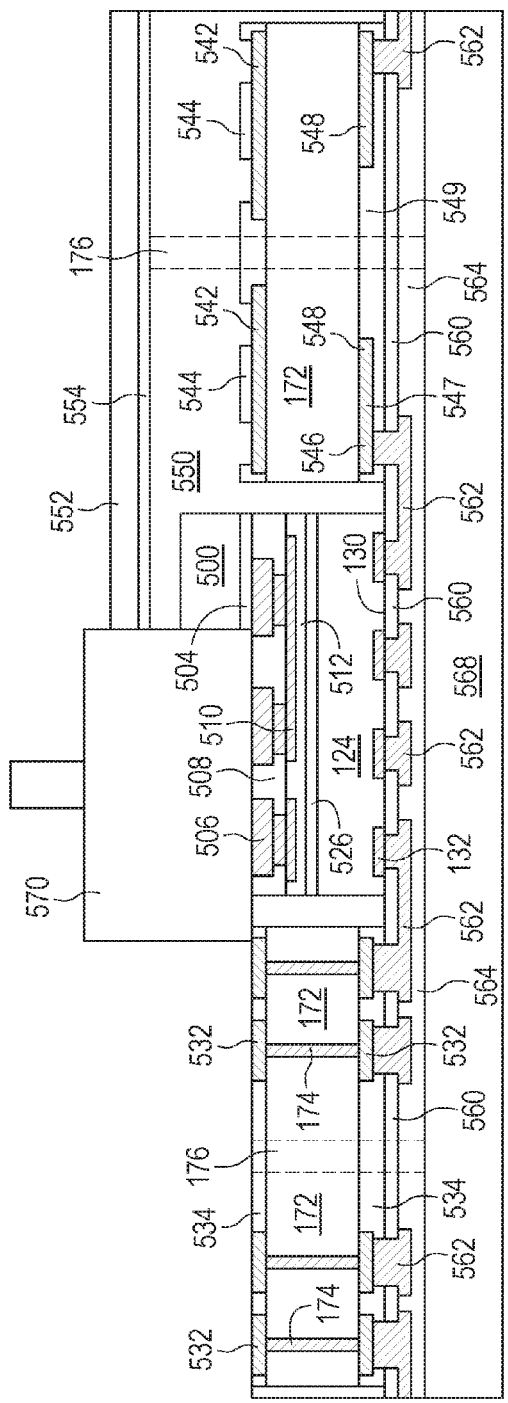
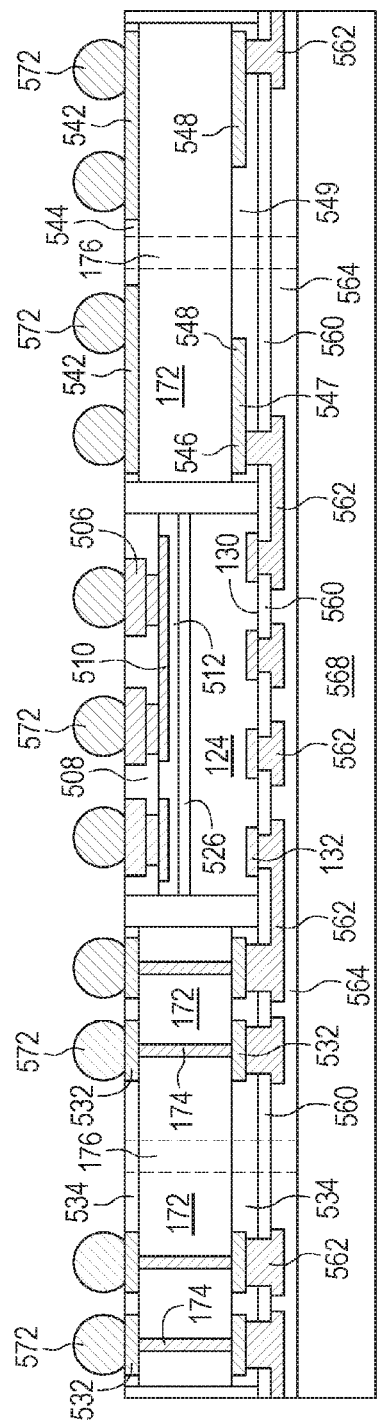
FIG. 8f
FIG. 8g

ANTENNA IN EMBEDDED WAFER-LEVEL BALL-GRID ARRAY PACKAGE

CLAIM OF DOMESTIC PRIORITY

The present application claims the benefit of U.S. Provisional Application No. 62/198,522, filed Jul. 29, 2015, which application is incorporated herein by reference.

FIELD OF THE INVENTION

The present invention relates in general to semiconductor devices and, more particularly, to a semiconductor device including an antenna in an embedded wafer-level ball-grid array (eWLB) package and a method of forming the same.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal-oxide-semiconductor field-effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to integrate additional features into a semiconductor package. Integrating features into a semiconductor package reduces cost and complexity of manufacturing the final electronic device. One growing use for semiconductor devices is as radar sensors in the automotive field for detecting nearby vehicles and other obstacles. Radar is finding increased importance in the growing field of self-driving vehicles. An electronic device on a vehicle emits electromagnetic radiation to illuminate nearby objects, and then observes the reflected radiation to determine the relative position and speed of the nearby objects. Emitting and observing reflected radiation is done by one or more antennae located on the vehicle. The antennae are formed on a printed circuit board (PCB) near a semiconductor package containing a monolithic microwave integrated circuit (MMIC) or other radar integrated circuit. A manufacturer of the radar system must design and implement proper antenna and shielding on a PCB. The antenna and grounding on the PCB increases manufacturing cost and complexity.

SUMMARY OF THE INVENTION

A need exists for a semiconductor package including a radar processing integrated circuit and a self-defined antenna within the same package. Accordingly, in one embodiment, the present invention is a method of making a semiconductor device comprising the steps of providing a semiconductor die, depositing an encapsulant over the semiconductor die, forming a first conductive layer including an antenna over a first surface of the encapsulant, and forming a second conductive layer including a ground plane over a second surface of the encapsulant. The antenna is located within a footprint of the ground plane.

In another embodiment, the present invention is a method of making a semiconductor device comprising the steps of providing a semiconductor die, disposing a PCB unit adjacent to the semiconductor die, depositing an encapsulant over the semiconductor die and PCB unit, forming an antenna over the encapsulant, semiconductor die, and PCB unit, and forming a ground plane opposite the antenna.

In another embodiment, the present invention is a semiconductor device comprising a semiconductor die. An encapsulant is deposited over the semiconductor die. A first conductive layer including an antenna is formed over a first surface of the encapsulant. A second conductive layer including a ground plane is formed over a second surface of the encapsulant opposite the first surface.

In another embodiment, the present invention is a semiconductor device comprising a semiconductor die and an encapsulant deposited over the semiconductor die to form a reconstituted wafer. An antenna is formed over the reconstituted wafer. A ground plane is formed over the reconstituted wafer opposite the antenna.

BRIEF DESCRIPTION OF THE DRAWINGS

FIGS. 3a-3j illustrate a method of forming a radar transceiver package with a self-defined antenna and a semiconductor die;

FIG. 4 illustrates the radar transceiver package;

FIGS. 8a-8i illustrate forming a backside redistribution layer on a dummy die.

DETAILED DESCRIPTION OF THE DRAWINGS

Figure 1:
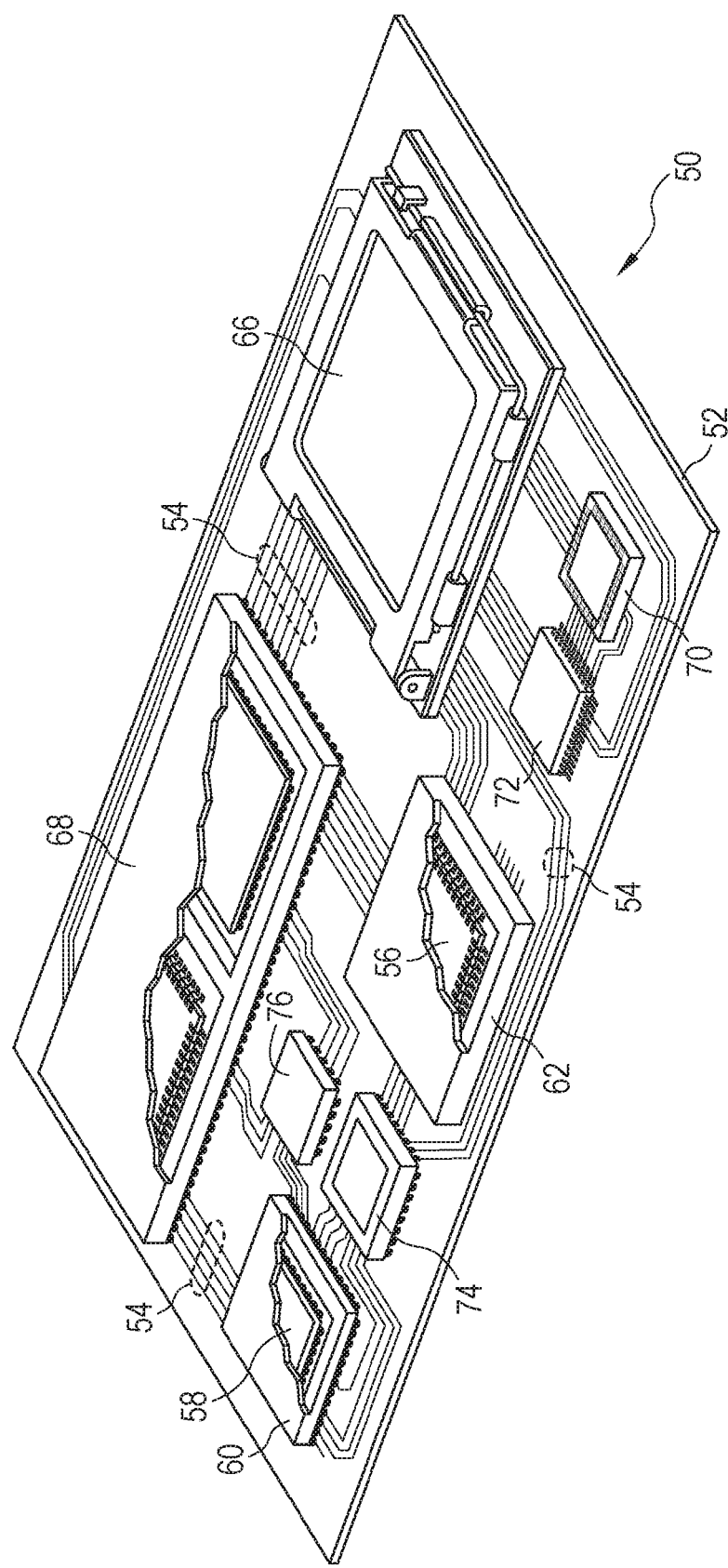
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
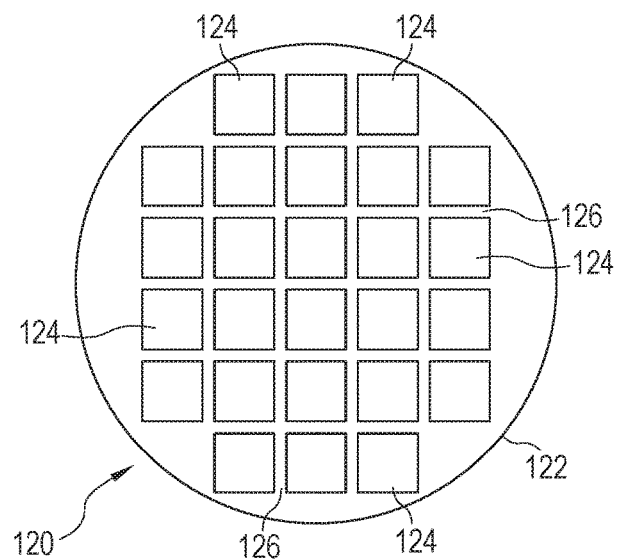
FIGS. 2a-2d illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
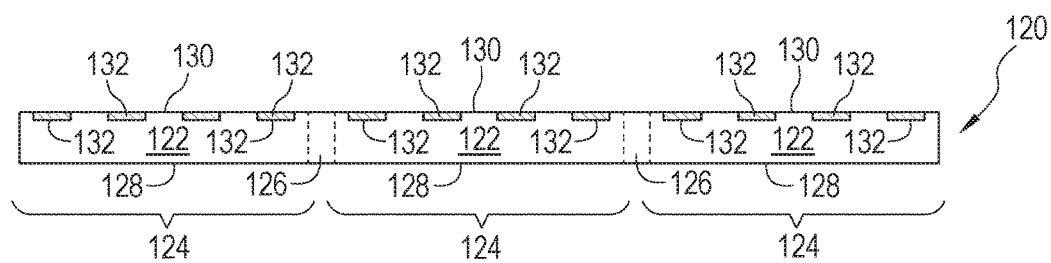

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, MEMS, memory, or other signal processing circuit. Semiconductor die 124 may also contain integrated passive devices (IPDs), such as inductors, capacitors, and resistors, for RF signal processing. In one embodiment, active surface 130 includes active and passive circuitry as required to form an MMIC or other radar transceiver circuit. Back surface 128 of semiconductor wafer 120 may undergo an optional backgrinding operation with a mechanical grinding or etching process to remove a portion of base material 122 and reduce the thickness of semiconductor wafer 120 and semiconductor die 124.

An electrically conductive layer 132 is formed over active surface 130 using PVD, CVD, electrolytic plating, electroless plating process, or other suitable metal deposition process. Conductive layers 132 include one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
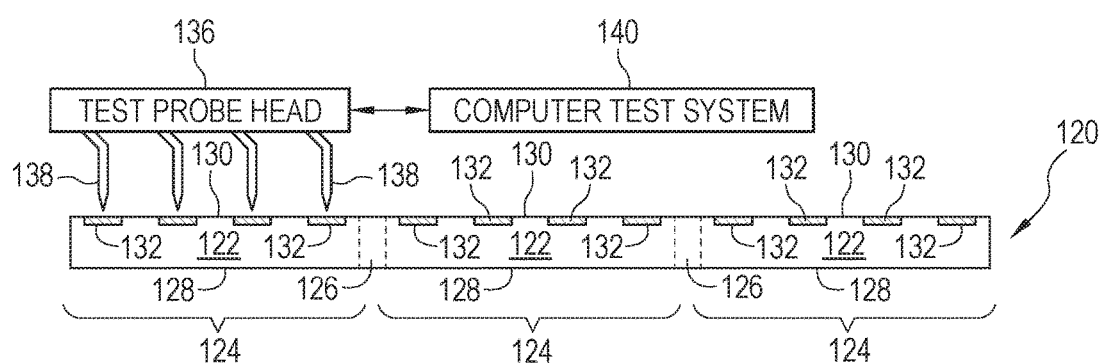

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 132 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
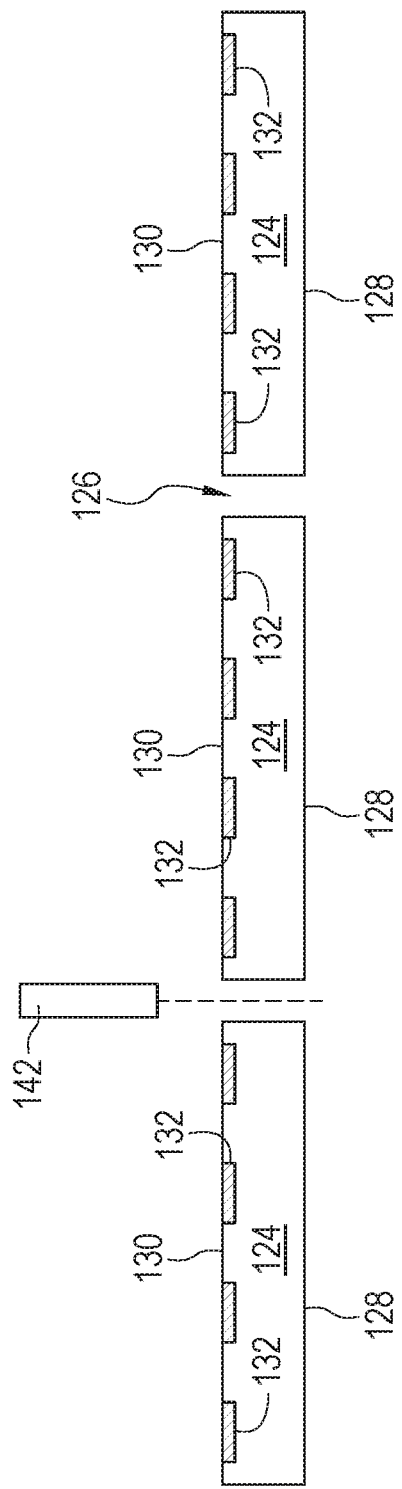

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post-singulation.

Figure 3A:
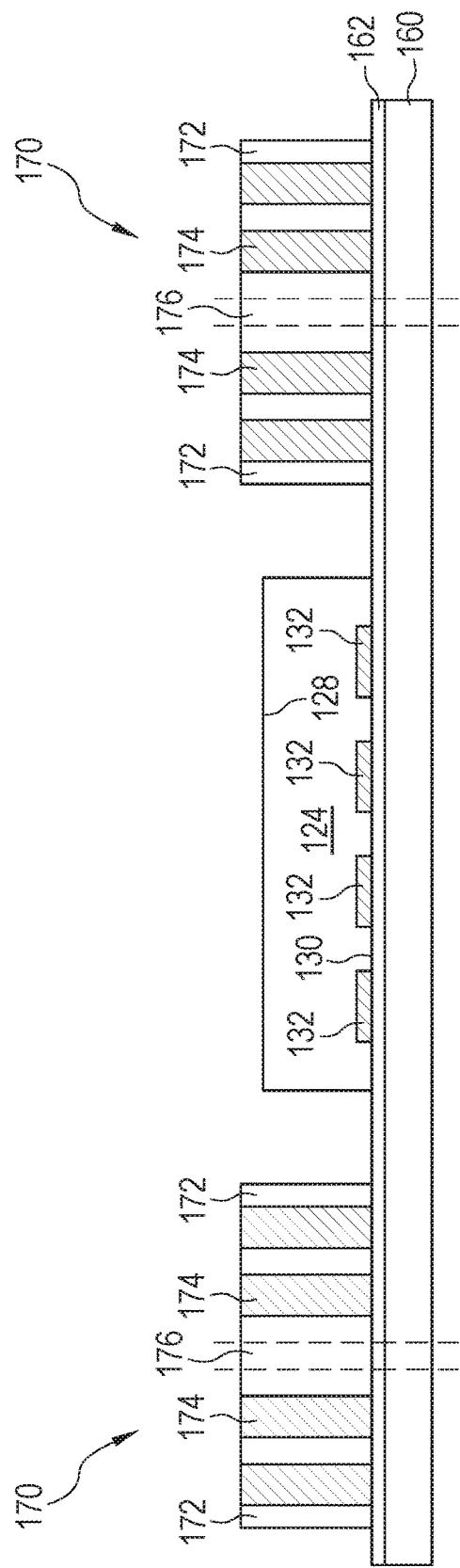

FIG. 3a shows a cross-sectional view of a portion of a carrier or temporary substrate 160 containing sacrificial base material such as silicon, polymer, beryllium oxide, glass, or other suitable low-cost, rigid material for structural support. An interface layer or double-sided tape 162 is formed over carrier 160 as a temporary adhesive bonding film, etch-stop layer, or thermal release layer.

Carrier 160 can be a round or rectangular panel (greater than 300 mm) with capacity for multiple semiconductor die 124. Carrier 160 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 160 is selected independent of the sizes of semiconductor die 124 and semiconductor wafer 120. That is, carrier 160 has a fixed or standardized size, which can accommodate various size semiconductor die 124 singulated from one or more semiconductor wafers 120. In one embodiment, carrier 160 is circular with a diameter of 206 mm. In another embodiment, carrier 160 is rectangular with a width of 560 mm and length of 600 mm. Semiconductor die 124 may have dimensions of 5 mm by 5 mm, which are placed on the standardized carrier 160. Alternatively, semiconductor die 124 may have dimensions of 10 mm by 10 mm, which are placed on the same standardized carrier 160. Accordingly, standardized carrier 160 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 160 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Semiconductor die 124 from FIG. 2d are mounted onto carrier 160 and interface layer 162 using, for example, a pick and place operation with active surface 130 of semiconductor die 124 oriented toward the carrier. While a single semiconductor die 124 is illustrated in FIG. 3a, carrier 160 generally has more semiconductor die mounted on the carrier that are not illustrated. Sufficient space is left between adjacent semiconductor die 124 when mounting the semiconductor die on carrier 160 to allow a plurality of PCB or eBAR units 170 to be disposed on the carrier between the semiconductor die.

PCB units 170 begin with a core substrate 172. Core substrate 172 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. In one embodiment, core substrate 172 is a composite with woven fiber and filler. In another embodiment, core substrate 172 is formed from an encapsulant or molding compound. Alternatively, core substrate 172 includes one or more insulating or passivation layers.

A plurality of through-vias is formed through core substrate 172 using laser drilling, mechanical drilling, or deep reactive ion etching (DRIE). The vias extend completely through core substrate 172. The vias are filled with Al, Cu, Sn, Ni, Au, Ag, titanium (Ti), tungsten (W), or other suitable electrically conductive material using electrolytic plating, electroless plating, or other suitable deposition process to form z-direction vertical interconnect conductive vias or plated through holes (PTHs) 174. In some embodiments where core substrate 172 is a molding compound, the molding compound is deposited around vias 174 that are pre-formed as conductive pillars.

Alternatively, a conductive layer is formed over the sidewalls of the through-vias using PVD, CVD, electrolytic plating, electroless plating, or other suitable metal deposition process, and a center portion of the through-vias is filled with a conductive filler material, e.g., Cu paste, or an insulating filler material, e.g., a polymer plug. In some embodiments, contact pads and a passivation layer are formed on the top and bottom surfaces of PCB units 170. PCB units 170 include a central area reserved as saw streets 176. Saw streets 176 are subsequently cut through when singulating semiconductor die 124, with the conductive vias 174 on each side of saw street 176 being packaged with an associated semiconductor die 124.

Figure 3B:
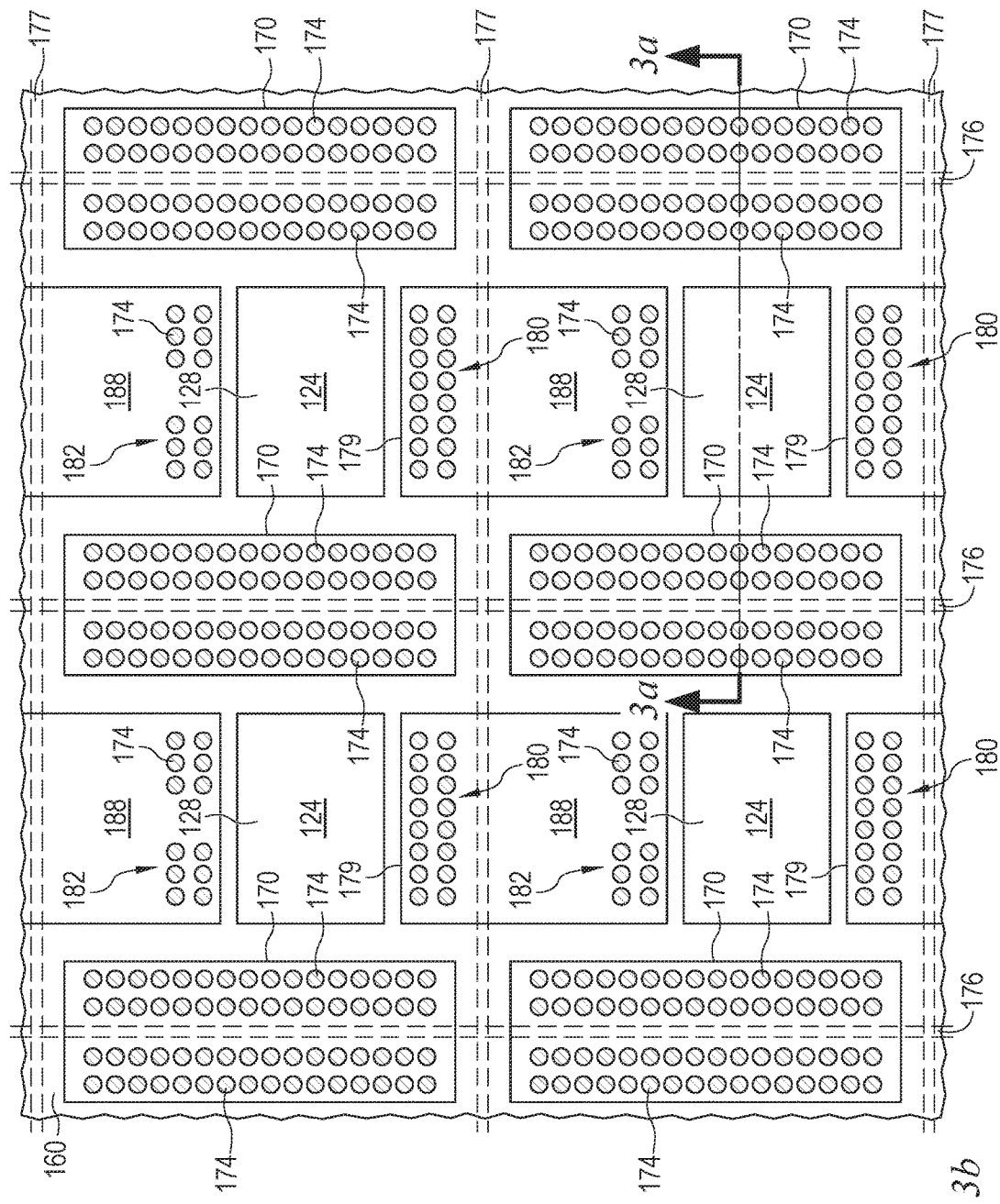

FIG. 3b illustrates a plan view of an area of carrier 160 showing four semiconductor die 124. Active surfaces 130 of semiconductor die 124 are oriented toward carrier 160, and back surfaces 128 are oriented toward the viewer in FIG. 3b. Each semiconductor die 124 is flanked by two PCB units 170, as shown in FIG. 3a. The view of FIG. 3b also reveals PCB units 179, which are not visible in the cross-section of FIG. 3a. PCB units 179 are similar to PCB units 170, but are formed or singulated to a different length and width and include a different configuration of conductive vias 174. Each PCB unit 179 includes a group of conductive vias 180 associated with a first semiconductor die 124 and a group of conductive vias 182 associated with a second semiconductor die 124. A region 188 of each PCB unit 179 remains reserved as a location where a radar antenna will subsequently be formed. In some embodiments, a radar antenna and ground layer are formed over opposite sides of PCB unit 179 prior to disposing PCB unit 179 on carrier 160. In the illustrated embodiment, group 182 of conductive vias 174 is formed without conductive vias 174 near the center of the group to reduce interference with a transmission line connecting semiconductor die 124 to the antenna to be formed in region 188. Saw streets 177 illustrate the locations where semiconductor die 124 are subsequently singulated through PCB units 179 to form a final singulated package.

In FIG. 3c, an encapsulant or molding compound 190 is deposited over carrier 160 including semiconductor die 124, PCB units 170, and PCB units 179 as an insulating material using a paste printing, compressive molding, transfer molding, liquid encapsulant molding, vacuum lamination, spin coating, or other suitable applicator. In particular, encapsulant 190 covers the side surfaces and surface 128 of semiconductor die 124 and the side surfaces and top surfaces of PCB units 170 and 179. Encapsulant 190 can be polymer composite material, such as epoxy resin with filler, epoxy acrylate with filler, or polymer with proper filler. Encapsulant 190 is non-conductive and environmentally protects the semiconductor device from external elements and contaminants. Encapsulant 190 also protects semiconductor die 124 from degradation due to exposure to light. Encapsulant 190, semiconductor die 124, and the PCB units 170 and 179 together form a reconstituted wafer 192 on carrier 160.

In FIG. 3d, reconstituted wafer 192 is flipped over and bonded on an optional second carrier 208, similar to carrier 160, with optional interface layer 209. An insulating or passivation layer 210 is formed over semiconductor die 124, encapsulant 190, PCB units 170, and PCB units 179. Insulating layer 210 contains one or more layers of silicon dioxide (SiO2), silicon nitride (Si3N4), silicon oxynitride (SiON), tantalum pentoxide (Ta2O5), aluminum oxide (Al2O3), solder resist, other material having similar insulating and structural properties. Insulating layer 210 includes a surface opposite semiconductor die 124 that is substantially flat across reconstituted wafer 192. A portion of insulating layer 210 is removed by LDA, etching, or other suitable process to expose conductive layer 132 on semiconductor die 124 and conductive vias 174 of the PCB units for subsequent electrical interconnect.

An electrically conductive layer 212 is formed over insulating layer 210 and reconstituted wafer 192 using PVD, CVD, electrolytic plating, electroless plating, or other suitable metal deposition process. Conductive layer 212 contains one or more layers of Al, Cu, Sn, Ni, Au, Ag, or other suitable electrically conductive material. In one embodiment, conductive layer 212 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 212 is electrically connected to conductive layer 132 and conductive vias 174 through openings in insulating layer 210.

Portions of conductive layer 212 can be electrically common or electrically isolated depending on the design and function of semiconductor die 124. Portions 212A are conductive traces that operate as a redistribution layer (RDL) to fan-out and extend electrical connection from conductive layer 132 of semiconductor die 124 to conductive vias 174. Conductive traces 212A are used by semiconductor die 124 to transmit and receive digital and analog signals to and from other devices on PCB 52. The signals travel through conductive vias 174 to and from subsequently formed backside interconnects.

Figure 3E:
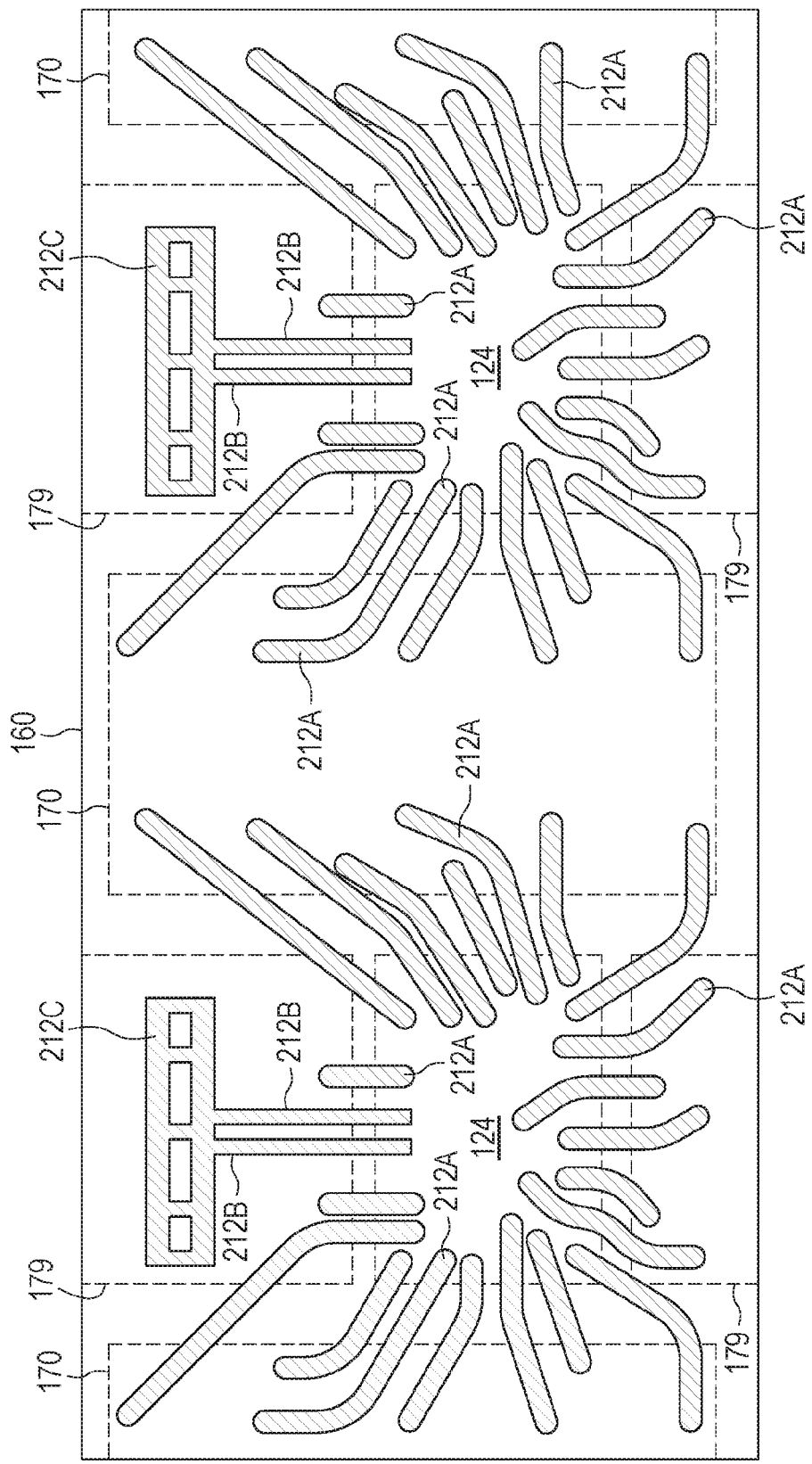

Conductive layer 212 includes transmission line 212B coupled to contact pads 132B. Transmission line 212B connects semiconductor die 124 to antenna 212C, which is formed as part of conductive layer 212 and visible in the plan view of FIG. 3e. Antenna 212C is formed over surface 198 of reconstituted wafer 192 within a footprint of region 188 over PCB units 179. In one embodiment, transmission line 212B is a half-wavelength transmission line and antenna 212C is a dipole antenna with two quarter-wavelength sections extending in opposite directions from transmission line 212B. Antenna 212C is used by semiconductor die 124 to transmit and receive radar signals.

An insulating or passivation layer 214 is formed over conductive layer 212 and insulating layer 210. Insulating layer 214 contains one or more layers of SiO2, Si3N4, SiON, Ta2O5, Al2O3, or other material having similar insulating and structural properties. Insulating layer 214 includes a surface opposite semiconductor die 124 that is substantially flat across reconstituted wafer 192. Insulating layer 214 remains covering conductive layer 212 in the final product for environmental protection. Radar signals leaving and returning to antenna 212C travel through insulating layer 214 without significant signal loss.

Figure 3F:
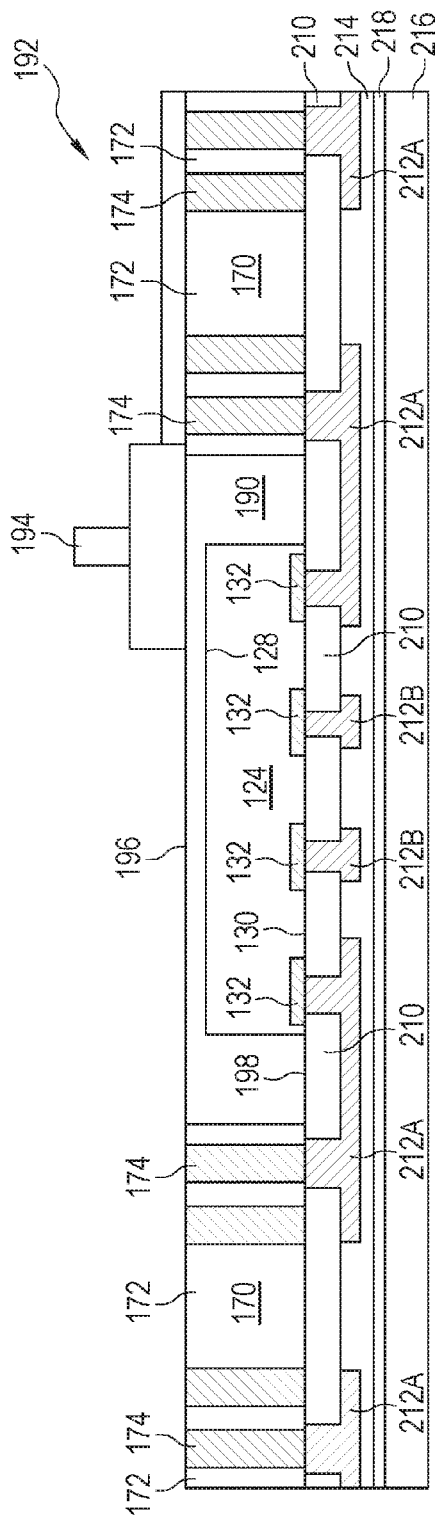

In FIG. 3f, reconstituted wafer 192 is flipped and disposed on an optional carrier 216 with optional interface layer 218. Encapsulant 190 undergoes a back grinding operation with grinder 194 or other suitable mechanical or etching process to reduce a thickness of reconstituted wafer 192 and expose conductive vias 174 of PCB units 170 and 179. The back grinding operation leaves new back surface 196 of reconstituted wafer 192 substantially uniform and planar across the entire width of the reconstituted wafer. A portion of encapsulant 190 remains over semiconductor die 124 after back grinding. In other embodiments, the back grinding operation exposes back surface 128 of semiconductor die 124, or removes a portion of the semiconductor die to reduce a thickness of the semiconductor die.

Reconstituted wafer 192 includes back surface 196 and front surface 198. Back surface 196 includes surfaces of encapsulant 190, core substrate 172, and conductive vias 174, which are all approximately coplanar. In some embodiments, back surface 128 of semiconductor die 124 is exposed and approximately coplanar as part of back surface 196. Front surface 198 includes surfaces of encapsulant 190, core substrate 172, and conductive vias 174, as well as active surface 130 of semiconductor die 124, which are all approximately coplanar. Conductive vias 174 are exposed at both back surface 196 and front surface 198 as a z-direction vertical interconnect through encapsulant 190.

Figure 3G:
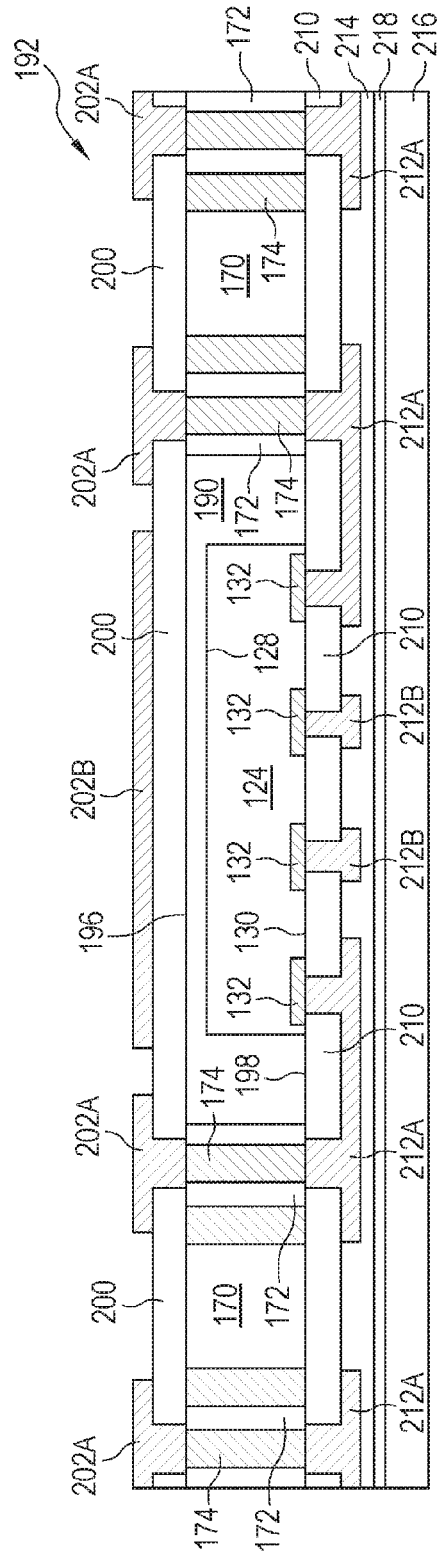

FIG. 3g illustrates a backside redistribution layer and ground plane formed over back surface 196 of reconstituted wafer 192. An optional insulating or dielectric layer 200 is formed over surface 196. Insulating layer 200 contains one or more layers of SiO2, Si3N4, SiON, Ta2O5, Al2O3, or other material having similar insulating and structural properties. Insulating layer 200 extends across reconstituted wafer 192. A portion of insulating layer 200 is removed by LDA, etching, or other suitable process to expose conductive vias 174 for subsequent electrical interconnect. Insulating layer 200 provides insulating for back surface 128 of semiconductor die 124 in embodiments where semiconductor die 124 is exposed from encapsulant 190.

An electrically conductive layer 202 is formed over insulating layer 200 and reconstituted wafer 192 using PVD, CVD, electrolytic plating, electroless plating, or other suitable metal deposition process. Conductive layer 202 contains one or more layers of Al, Cu, Sn, Ni, Au, Ag, or other suitable electrically conductive material. In one embodiment, conductive layer 202 includes an adhesion or seed layer of Ti/Cu, TiW/Cu, or a coupling agent/Cu. Another metal with good wet etching selectivity, such as Ni, Au, or Ag, is optionally added to the seed layer. The seed layer is deposited by sputtering, electroless plating, or by depositing laminated Cu foil combined with electroless plating. Conductive layer 202 is electrically connected to conductive vias 174 through the openings in insulating layer 200.

Portions of conductive layer 202 can be electrically common or electrically isolated depending on the design and function of semiconductor die 124. In particular, conductive layer 202 includes contact pads and signal traces that form a fan-out or fan-in redistribution layer. Contact pads 202A provide locations for subsequent interconnect structures to be formed. Conductive traces 202C, visible in the plan view of FIG. 3i, operate to fan-out and extend electrical connection from conductive vias 174 across back surface 196. Conductive layer 202 also includes a ground plane 202B. Ground plane 202B is formed over region 188 within a footprint of PCB unit 179 opposite antenna 212C, and operates as a ground plane for the antenna that gives the antenna directionality.

Semiconductor die 124 uses antenna 212C to transmit and receive radar signals in one embodiment. Radar signals are generated as electromagnetic radiation from antenna 212C travelling away from ground plane 202B. The radar signals reflect off of remote objects over surface 198 and return to antenna 212C. Reflected electromagnetic radiation hitting antenna 212C generates an electric signal back to semiconductor die 124 through transmission line 212B. Semiconductor die 124 measures the amount of time between transmitting a radar signal using antenna 212C and receiving the reflected signal. The time until a reflected signal is received is used by semiconductor die 124 to calculate the distance of the object over surface 198.

Ground plane 202B was formed over conductive via grouping 182 of PCB unit 179. Grouping 182 of conductive vias 174 are electrically coupled to ground through ground plane 202B. Conductive vias 174 extend perpendicularly between antenna 212C and semiconductor die 124 to provide additional shielding for the semiconductor die. PCB unit 179 is also electrically connected to semiconductor die 124 by conductive traces 212A to provide a ground connection to the semiconductor die.

Figure 3H:
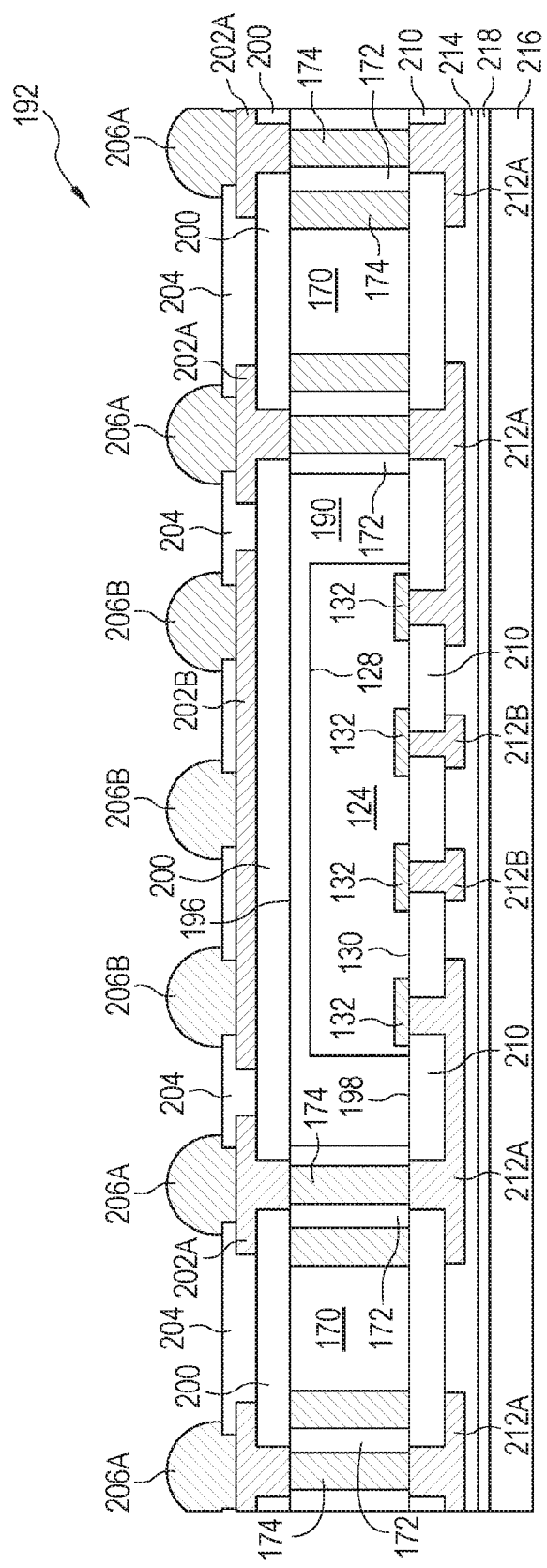

In FIG. 3h, an insulating or passivation layer 204 is formed over insulating layer 200 and conductive layer 202. Insulating layer 204 contains one or more layers of SiO2, Si3N4, SiON, Ta2O5, Al2O3, or other material having similar insulating and structural properties. Insulating layer 204 follows the contour of conductive layer 202. Accordingly, exposed portions of insulating layer 200 and conductive layer 202 are covered by insulating layer 204. Insulating layer 204 includes a surface opposite semiconductor die 124 that is substantially flat or planar across reconstituted wafer 192. A portion of insulating layer 204 is removed by LDA, etching, or other suitable process to expose conductive layer 202 for subsequent electrical interconnect.

An electrically conductive bump material is deposited over conductive layer 202 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 202 using a suitable attachment or bonding process. In one embodiment, the bump material is reflowed by heating the material above its melting point to form balls or bumps 206. In some applications, bumps 206 are reflowed a second time to improve electrical contact to conductive layer 202. In one embodiment, bumps 206 are formed over an under bump metallization (UBM) layer. Bumps 206 can also be compression bonded or thermocompression bonded to conductive layer 202. Bumps 206 represent one type of interconnect structure that can be formed over conductive layer 202. The interconnect structure can also use bond wires, conductive paste, stud bump, micro bump, or other electrical interconnect.

Bumps 206 provide a ball-grid array connection to PCB 52 or another substrate. Bumps 206A are formed over PCB units 170 and electrically connected to a conductive via 174 by contact pad 202A. When mounted to a substrate, bumps 206A provide connection to active surface 130 of semiconductor die 124 through conductive vias 174 and conductive traces 212A. Bumps 206B are formed over ground plane 202B. Bumps 206B provide a connection for ground plane 202B to a ground signal from the underlying substrate. A plurality of bumps 206B are provided in some embodiments to increase the electrical current capacity to and from ground plane 202B.

Figure 3I:
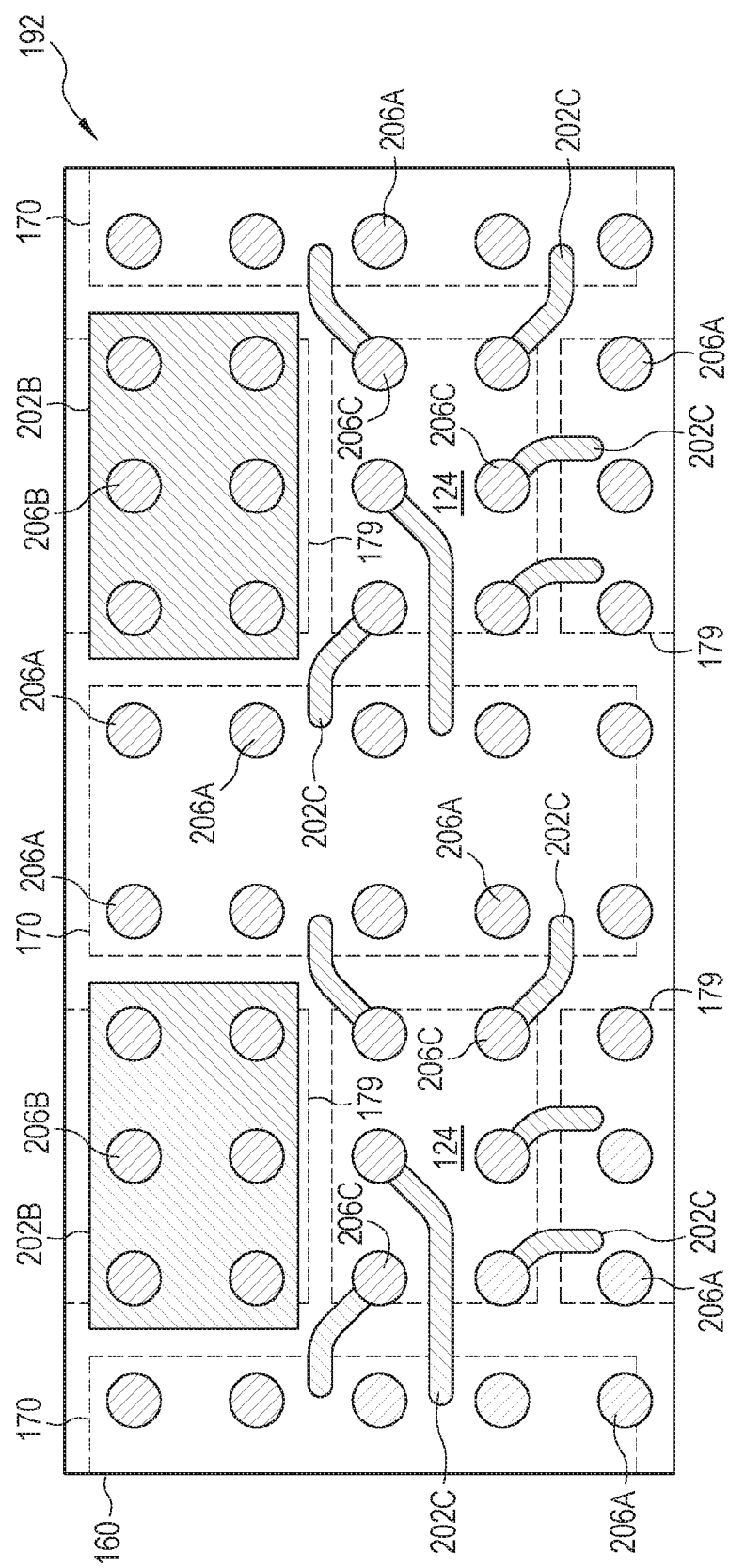

FIG. 3i shows back surface 196 of reconstituted wafer 192 with conductive bumps 206 spread out across the reconstituted wafer. Insulating layer 204 is not illustrated, so that conductive layer 202 is visible. Some bumps 206, labelled as bumps 206A, are disposed directly over, or within a footprint of, PCB units 170 and 179. Bumps 206A are coupled to underlying conductive vias 174 by contact pads 202A. Bumps 206B are formed directly on and over ground plane 202B. Each ground plane 202B includes six bumps 206B formed on the ground plane, but more or less bumps per ground plane are used in other embodiments. Bumps 206C are formed away from PCB units 170 and 179, e.g., over semiconductor die 124. Bumps 206C are formed on contact pads 202A, which are hidden from view by the bumps in the illustrated embodiment, and are coupled to conductive vias 174 by conductive traces 202C. Bumps 206C provide a fan-in configuration for the ball-grid array. In other embodiments, conductive traces 202C are used to fan-out bumps 206C. Conductive traces 202C are electrically connected to conductive vias 174 through openings of insulating layer 200, similar to contact pads 202A in FIG. 3h.

In FIG. 3j, reconstituted wafer 192 is singulated through core substrates 172 of PCB units 170 and 179 and insulating layers 200, 204, 210, and 214 with saw blade or laser cutting tool 220 through saw streets 176 and 177 to create a plurality of semiconductor packages 230 that each includes a radar transceiver die and a self-defined antenna. FIG. 4 shows a transceiver package 230 after singulation. Semiconductor die 124 is coupled to antenna 212C by transmission line 212B. Semiconductor die 124 sends and receives radar signals using transmission line 212B and antenna 212C. The signals are directed over active surface 130 of semiconductor die 124 because ground plane 202B reflects signals in the opposite direction.

The distance between antenna 212C and ground plane 202B is defined or controlled by the thickness of PCB units 170 and 179. Different thicknesses of PCB units are used to change the distance between ground plane 202B and antenna 212C, e.g., based on the intended radar frequency to be used. In one embodiment where 77 GHz radar signals are transmitted and received, the distance between ground plane 202B and antenna 212C is between 0.5 and 0.6 millimeters, and the total height of package 230 is approximately 0.8 millimeters. For applications at frequencies other than 77 GHz, the height of PCB units 170 and 179 are adjusted accordingly.

Transceiver packages 230 are mounted on PCBs 52 for use. Semiconductor die 124 is coupled to other components on a common or separate PCB 52 through conductive traces 212A, conductive vias 174, conductive traces 202C, contact pads 202A, and conductive bumps 206. A processor or controller communicates with semiconductor die 124 to receive information as to the distance of objects over antenna 212C from the antenna.

In one embodiment, a plurality of transceiver packages 230 are disposed on separate PCBs 52 at various locations on a motor vehicle. A controller or processor communicates with the plurality of transceiver packages 230 to determine whether objects are nearby the vehicle. When objects nearby the motor vehicle pose a potential danger, e.g., a wall or other obstacle in the direction of travel of the first motor vehicle, the controller alerts a driver of the vehicle to beware of the obstacle or automatically applies the vehicle's brakes.

In another embodiment, transceiver packages 230 are used to determine a distance to a second motor vehicle travelling in front of a first motor vehicle that includes transceiver packages 230. The speed of the first motor vehicle is controlled based on signals from semiconductor die 124 in order to maintain a relatively constant distance between the first motor vehicle and the second motor vehicle travelling in front of the first motor vehicle. In other embodiments, antenna 212C are used for other purposes besides radar transmission and reception.

Figure 5:
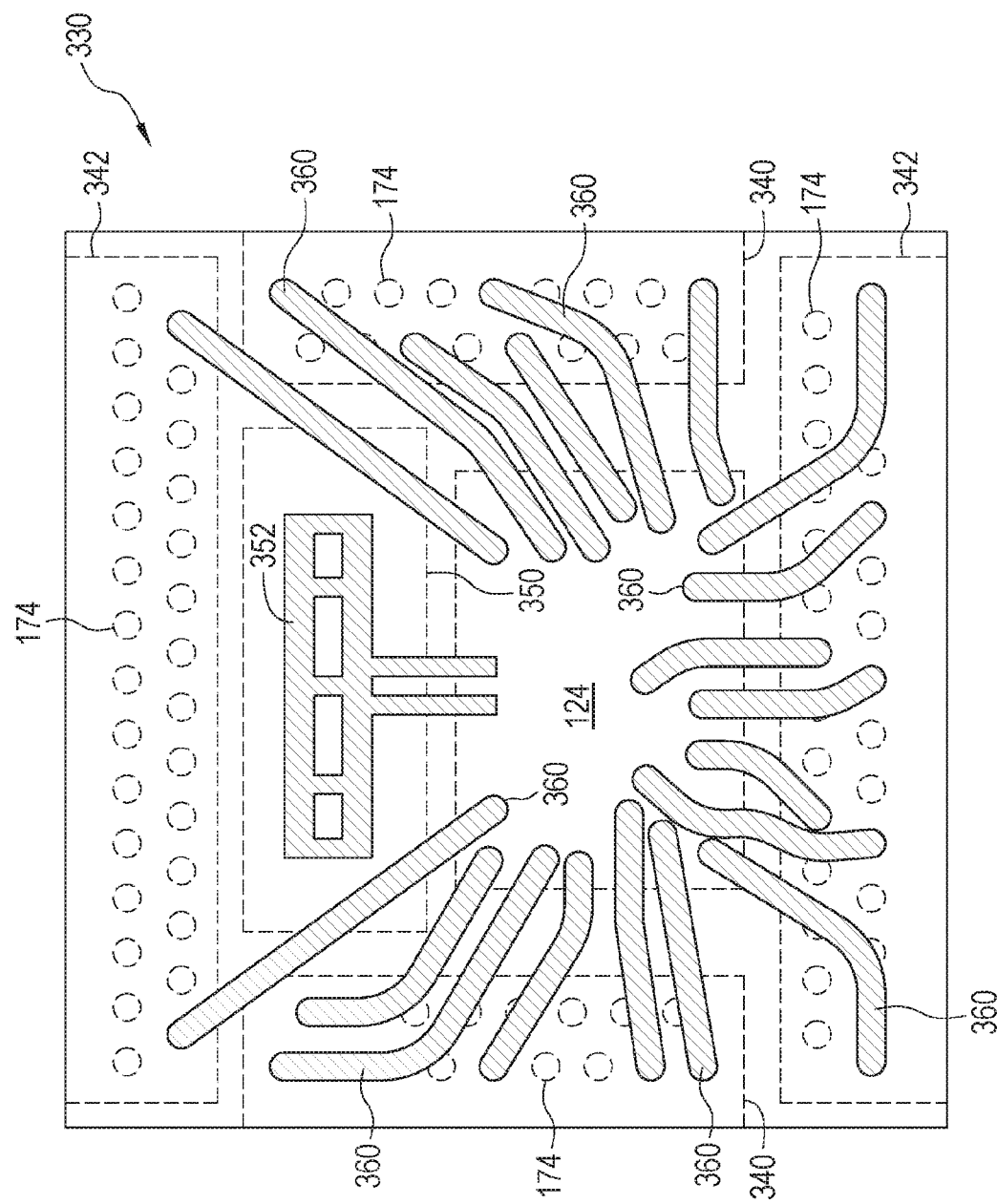
FIG. 5 illustrates a first alternative embodiment of the radar transceiver package.

FIG. 5 illustrates a plan view of an alternative transceiver package embodiment. Transceiver package 330 includes PCB units 340 and 342 that surround semiconductor die 124, ground plane 350, and antenna 352. Antenna 352 and ground plane 350 are formed on opposite sides of a reconstituted wafer similar to transceiver package 230. However, transceiver package 330 lacks a PCB unit between antenna 352 and semiconductor die 124. On the other hand, antenna 352 and semiconductor die 124 together are surrounded by PCB units 340 and 342 with some conductive vias 174 coupled to a ground reference voltage signal to provide good shielding from external influences. Transceiver package 330 includes conductive traces 360 formed as part of a conductive layer with antenna 352. Conductive traces 360 are similar to conductive traces 212C, and couple semiconductor die 124 to conductive vias 174 of PCB units 340 and 342. Transceiver package 330 includes conductive traces formed as part of a conductive layer with ground plane 350 to couple conductive vias 174 of the PCB units to conductive bumps 206 formed on the bottom of the transceiver packages. Transceiver package 330 includes insulating layer 214 for environmental protection. Transceiver package 330 operates similarly to transceiver package 230, but includes a modified PCB unit layout.

Figure 6B:
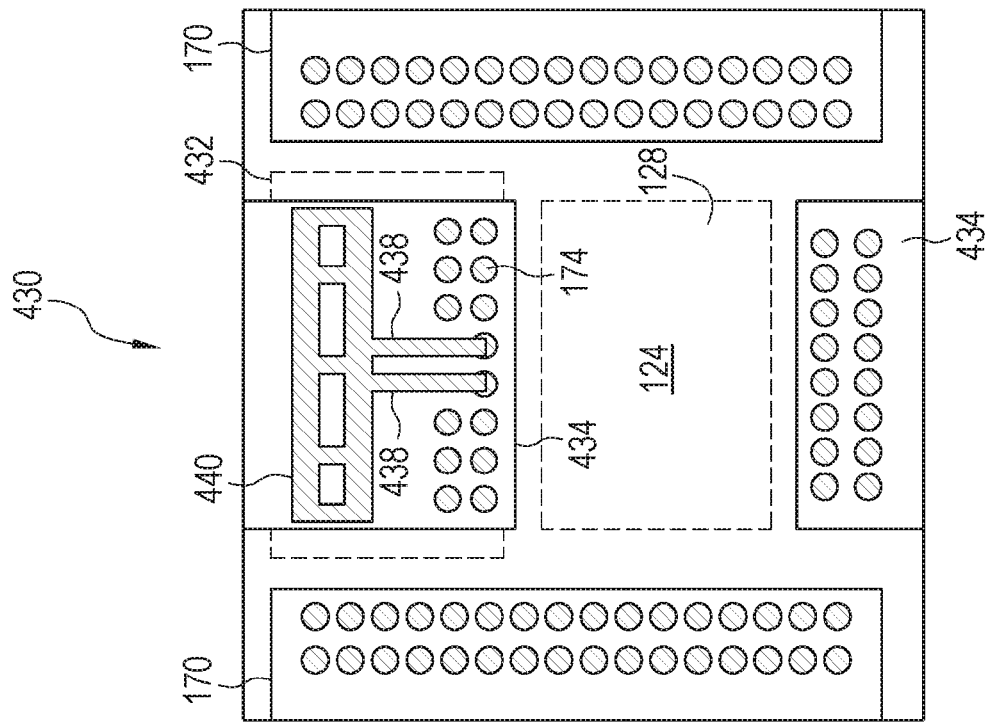
FIGS. 6a-6c illustrate a second alternative embodiment of the radar transceiver package.
Figure 6A:
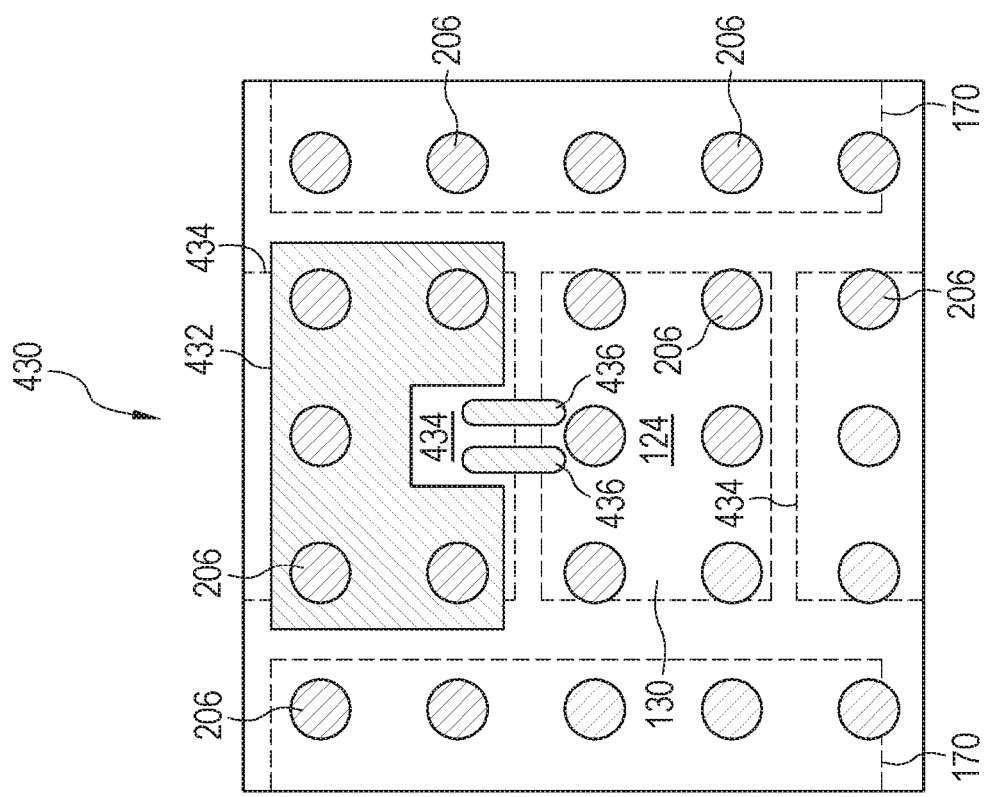
Figure 6C:
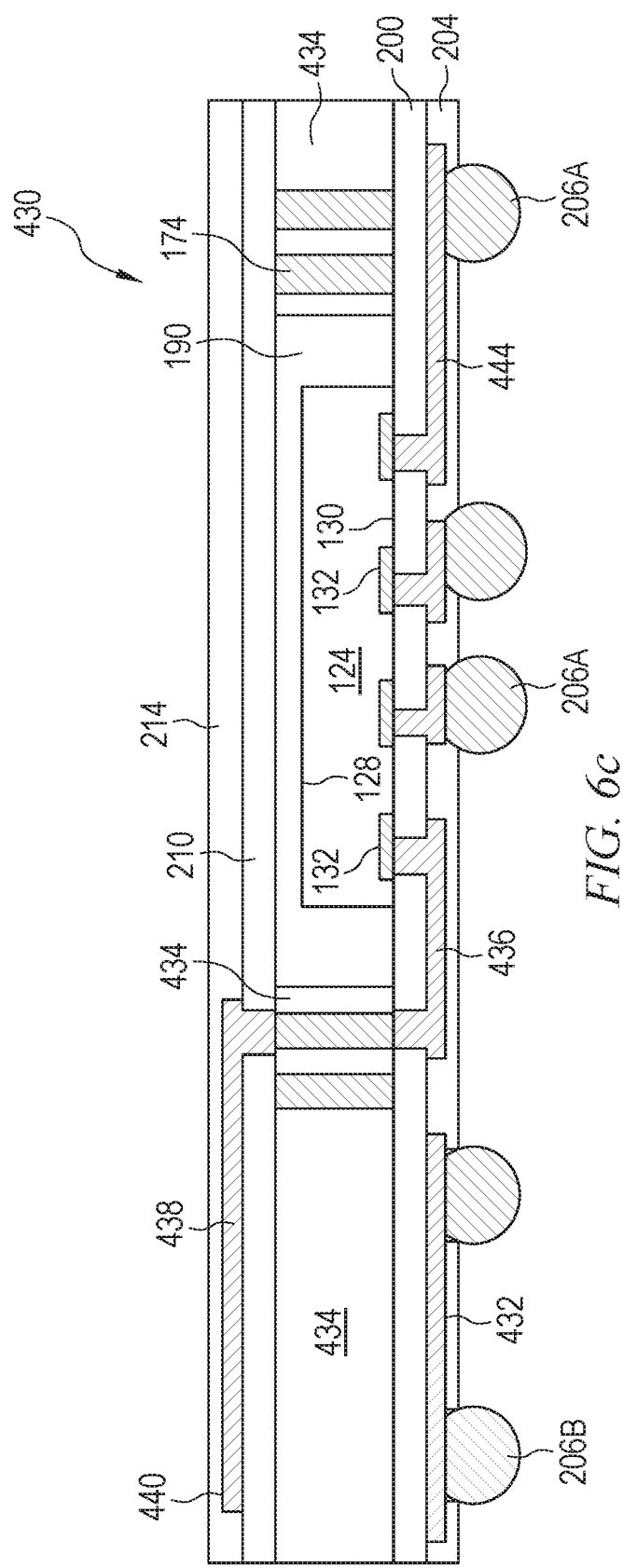

FIG. 6a-6c illustrates an embodiment with an antenna formed on a surface of the transceiver package opposite active surface 130 of semiconductor die 124. FIG. 6a illustrates the front side of transceiver package 430, with active surface 130 of semiconductor die 124 facing the viewer. A ground plane 432 is formed over PCB unit 434. Ground plane 432 includes a cutout over PCB unit 434 so that at least two conductive vias 174 of PCB unit 434 are not covered by the ground plane. Transmission line 436 couples contact pads 132 of semiconductor die 124 to conductive vias 174 of PCB unit 434. Transmission line 436 and conductive vias 174 couple signals to be transmitted from semiconductor die 124 to transmission line 438 on the back side of semiconductor package, i.e., the side of the package that back surface 128 of semiconductor die 124 faces. Additional conductive traces formed along with transmission line 436 are not illustrated, but couple conductive bumps 206 to contact pads 132 of semiconductor die 124.

FIG. 6b illustrates the back side of transceiver package 430 with back surface 128 of semiconductor die 124 facing the viewer. Antenna 440 is formed as a conductive layer over ground plane 432 and coupled to conductive vias 174 of PCB unit 434 by transmission lines 438. Antenna 440 is further coupled to contact pads 132 on active surface 130 by conductive vias 174 and transmission line 436. Antenna 440 is formed on an opposite surface of transceiver package 430 as ground plane 432, as in the previous embodiments. However, antenna 440 is formed opposite active surface 130 unlike the previously illustrated embodiments.

FIG. 6c illustrates a cross-sectional view of transceiver package 430. Active surface 130 of semiconductor die 124 faces downward toward conductive bumps 206. Ground plane 432 is formed on the bottom surface of transceiver package 430. Antenna 440 is formed over the top surface of transceiver package 430. Antenna 440 is formed directly opposite ground plane 432. Antenna 440 is coupled to contact pads 132 of semiconductor die 124 through transmission line 438, conductive vias 174, and transmission line 436. Ground plane 432 extends over conductive vias 174 of PCB unit 434 in another cross-section, and is coupled to contact pads 132 of semiconductor die 124 through conductive vias 174. Conductive traces 444 and bumps 206A provide interconnection for signals between semiconductor die 124 and an external processor or controller. Bumps 206B provide connection of a ground voltage reference from a substrate to ground plane 432 and semiconductor die 124. In some embodiments, a plurality of conductive vias 174 surrounding semiconductor die 124 are coupled to ground through bumps 206B, ground plane 432, and conductive traces 444 to provide shielding for semiconductor die 124.

Figure 7:
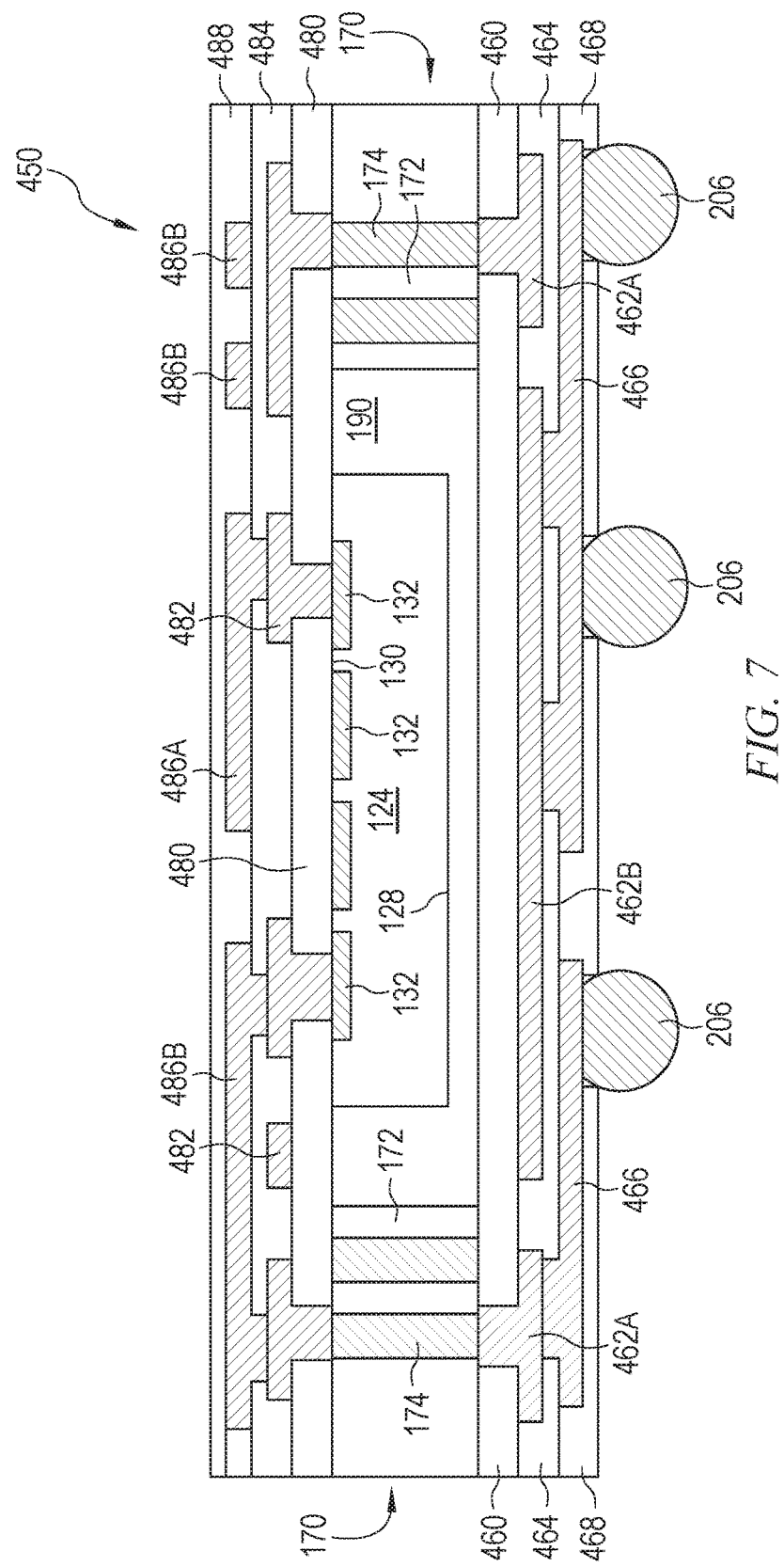
FIG. 7 illustrates a third alternative embodiment of the radar transceiver package.

FIG. 7 illustrates transceiver package 450 with two metal layers formed over each side of the package. Insulating layer 460 is formed over the back side of semiconductor die 124 in a similar manner to insulating layer 200 in FIG. 3g. Openings are formed through insulating layer 460, and conductive layer 462 is formed coupled to conductive vias 174 through insulating layer 460 in a similar manner to conductive layer 202 in FIG. 3g. Conductive layer 462 includes a ground plane 462B, as well as contact pads and conductive traces to fan-out or fan-in interconnection from conductive vias 174. Insulating layer 464 is formed over insulating layer 460 and conductive layer 462. Openings are formed in insulating layer 464 over conductive layer 462. Conductive layer 466 is formed over conductive layer 462 and insulating layer 464, and contacts conductive layer 462 through the openings in insulating layer 464. Insulating layer 468 is formed over conductive layer 466. Openings are formed in insulating layer 468, and conductive bumps 206 are formed on conductive layer 466 through the openings in insulating layer 468. Transceiver package 450 includes two metal layers over back surface 128 of semiconductor die 124. Having multiple metal layers allows implementation of additional electrical functions. A ground plane for the radar antenna of transceiver package 450 may be formed as part of the first metal layer 462, second metal layer 466, or in additional metal layers when more than two metal layers are used.

Transceiver package 450 includes insulating layers 480, 484, and 488 and conductive layers 482 and 486 formed over the front side of the reconstituted wafer in a similar manner to insulating layers 460, 464, and 468 and conductive layers 562 and 466. Conductive layer 482 includes conductive traces and contact pads to fan-out interconnection from semiconductor die 124 to conductive vias 174. Conductive layer 486 includes an antenna 486A, similar to antennae 212C, 352, and 440. Antenna 486A is formed over ground plane 462B on an opposite side of transceiver package 450. Conductive traces 486B are also formed as a part of conductive layer 486 to fan-out interconnection from semiconductor die 124. An antenna for transceiver package 450 can be formed as part of the first metal layer 482 or second metal layer 486, or another metal layer when more than two metal layers are used.

Any desired number of additional metal layers may be formed over either side of semiconductor die 124. The number of metal layers over back surface 128 need not be the same as the number of metal layers over active surface 130. Adding additional layers allows more complicated fan-out routing and other electrical features that are challenging with only a single metal layer. Additional metal layers may be added on either side of any of the previously discussed embodiments to increase the functionality of the embodiments.

Figure 8E:
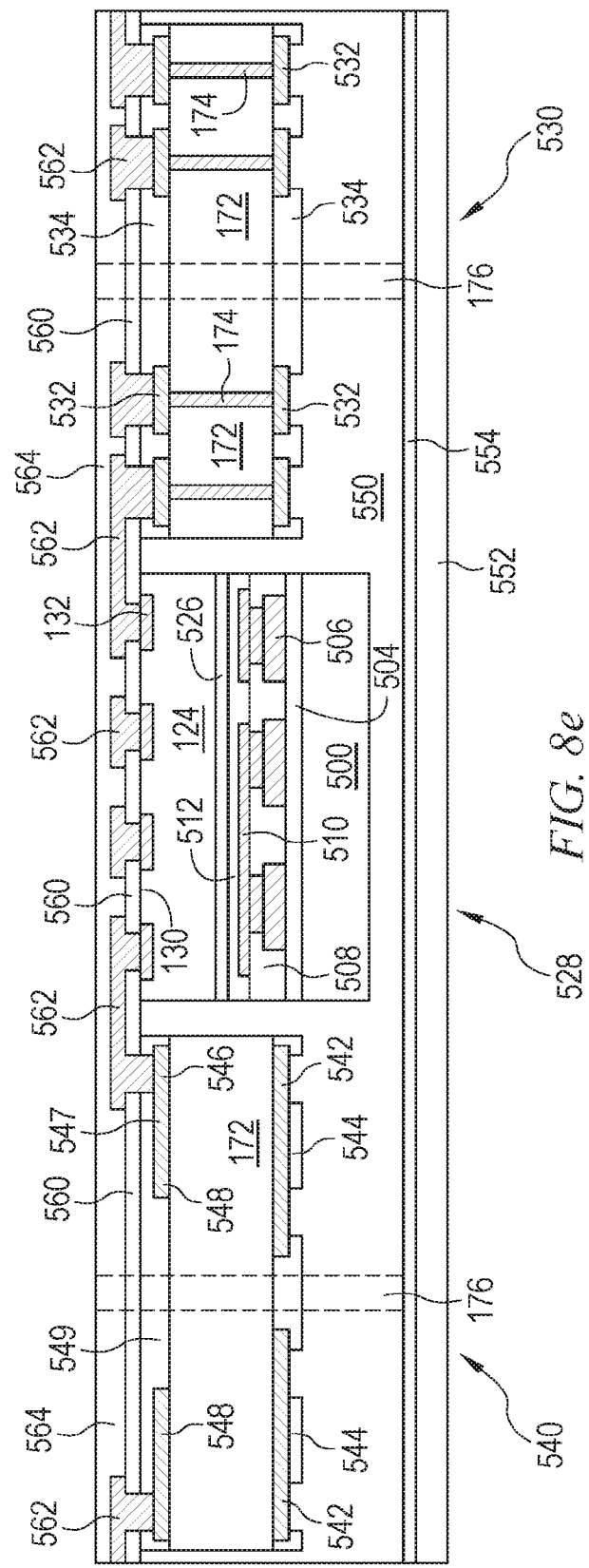

FIGS. 8a-8i illustrate using a dummy or sacrificial die to form a backside RDL for a radar transceiver package. In FIG. 8a, a dummy semiconductor die 500 is provided including an inverted RDL 502 formed over the dummy die. Semiconductor die 500 is similar to semiconductor die 124, but does not typically include active circuits formed in an active surface. In one embodiment, RDL 502 is formed while dummy die 500 remains part of a larger semiconductor wafer. In other embodiments, a glass wafer, PCB, or mold interconnect substrate is used instead of semiconductor material for dummy die 500.

Insulating layer 504 is formed over 500. In some embodiments, insulating layer 504 operates as an etch-stop layer for removing die 500 in a subsequent processing step. Contact pads 506 are formed over insulating layer 504 and within insulating layer 508. An RDL layer 510 is formed over contact pads 506 and insulating layer 508. A passivation layer 512 is formed over RDL layer 510.

In FIG. 8b, semiconductor die 124 is disposed on carrier 520 with active surface 130 oriented toward the carrier. An optional interface layer 522 is disposed between carrier 520 and semiconductor die 124. Dummy die 500 is disposed over semiconductor die 124 with RDL 502 oriented toward semiconductor die 124. A permanent adhesive layer 526 is deposited on semiconductor die 124 to bond RDL 502 to back surface 128. In some embodiments, both semiconductor die 124 and dummy die 500 are disposed on carrier 520 in wafer form, and then singulated after bonding with adhesive 526 to create individual die units 528. In other embodiments, singulated dummy die 500 are disposed on semiconductor die 124, which remains as wafer 120.

In FIG. 8c, PCB units 530 and 540 are disposed on carrier 520 between adjacent die units 528. In other embodiments, die units 528 from FIG. 8b are singulated and disposed on a separate carrier along with PCB units 530 and 540. PCB unit 530 includes core substrate 172 and conductive vias 174, as with PCB units 170. In addition, PCB units 530 include contact pads 532 and passivation layers 534 formed over the surfaces of core substrate 172. PCB unit 540 includes core substrate 172 with ground plane 542 on a first surface of the PCB unit. Passivation layer 544 is formed over ground plane 542. PCB unit 540 further includes contact pad 546, transmission line 547, and antenna 548 formed over a surface of core substrate 172 opposite ground plane 542. Antenna 548 is similar to antenna 212C. PCB unit 540 includes separate ground planes 542 and antennae 548 on opposite sides of saw street 176, each associated with a different semiconductor die 124 on opposite sides of PCB unit 540. In some embodiments, PCB units 530 are disposed on three sides of each semiconductor die 124, and a PCB unit 540 is placed on one side of each semiconductor die and shared by two adjacent semiconductor die.

In FIG. 8d, an encapsulant or molding compound 550 is deposited over carrier 520 including die units 528, PCB units 530, and PCB units 540 as an insulating material using a paste printing, compressive molding, transfer molding, liquid encapsulant molding, vacuum lamination, spin coating, or other suitable applicator. Encapsulant 550 fully covers dummy die 500 in one embodiment.

In FIG. 8e, the reconstituted wafer including die units 528, PCB units 530, and PCB units 540 is flipped and disposed on carrier 552 with optional interface layer 554. A dielectric layer 560 is formed over active surface 130 of semiconductor die 124 and PCB units 530 and 540. A conductive layer 562 is disposed on dielectric layer 560 and coupled to contact pads of PCB unit 530, PCB unit 540, and semiconductor die 124 through openings of dielectric layer 560. Conductive layer 562 is patterned to form a fan-out pattern from contact pads 132 of semiconductor die 124 to antenna 548 of PCB unit 530 and conductive vias 174 of PCB units 540. A passivation layer 564 is formed over dielectric layer 560 and conductive layer 562 for electrical isolation and environmental protection.

In FIG. 8f, the reconstituted wafer is flipped and placed on optional backgrinding tape 568. A backgrinding operation is performed with backgrinding tool 570 to remove dummy die 500 and expose contact pads of PCB unit 530, PCB unit 540, and RDL 502. Contact pads 132, contact pads 532, and ground plane 542 are all approximately the same distance from backgrinding tape 568 so that all contact pads are exposed at a similar backgrinding depth. A cleaning process is performed after backgrinding to remove surface metal residue and copper oxidation. In some embodiments, carrier 552 is removed prior to backgrinding by, e.g., a thermal or UV release. In FIG. 8g, conductive bumps 572 are formed on contact pads 132, contact pads 532, and ground plane 546. Conductive bumps 572 are similar to conductive bumps 206. In some embodiments, the reconstituted wafer is disposed on an optional thermal support tape during the bumping process, and an optional clamping chuck may be used.

Figure 8H:
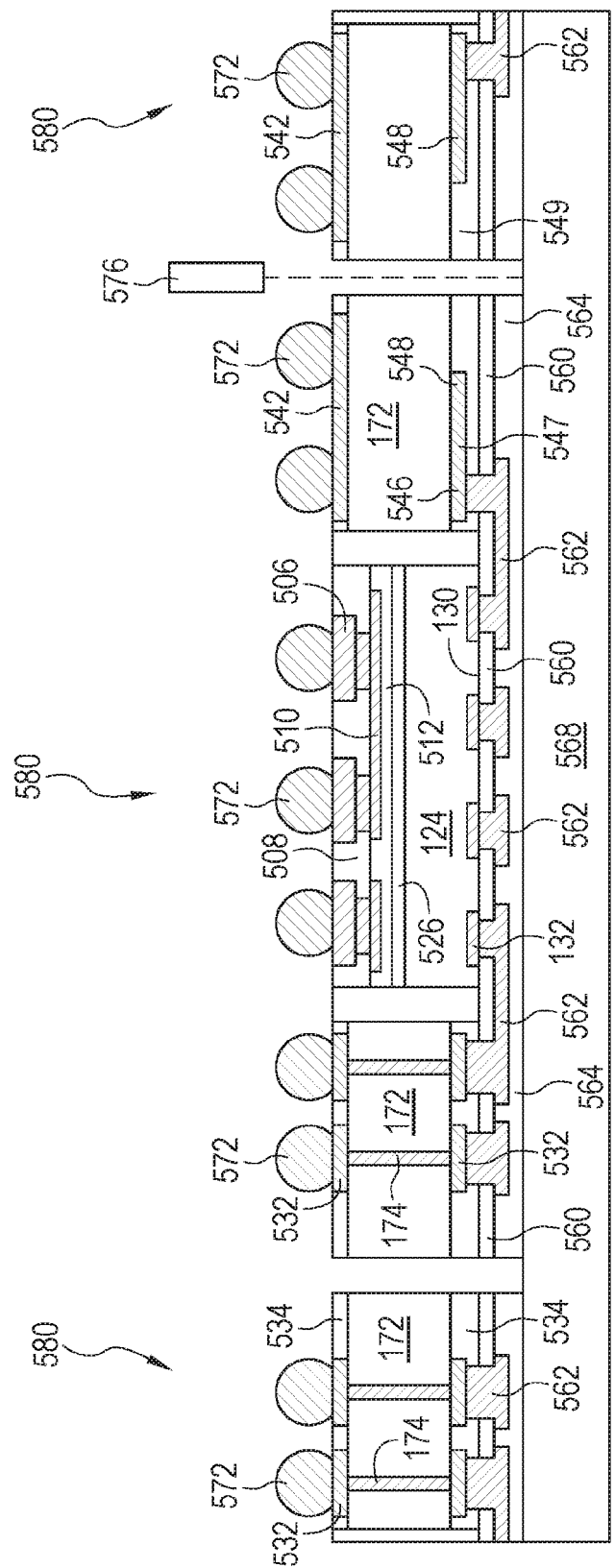

In FIG. 8h, semiconductor die 124 are singulated through PCB units 530 and 540 to separate the semiconductor die into separate transceiver packages 580. Each package 580 includes an antenna 548 and ground plane 542 formed on opposite sides of the package.

Figure 8I:
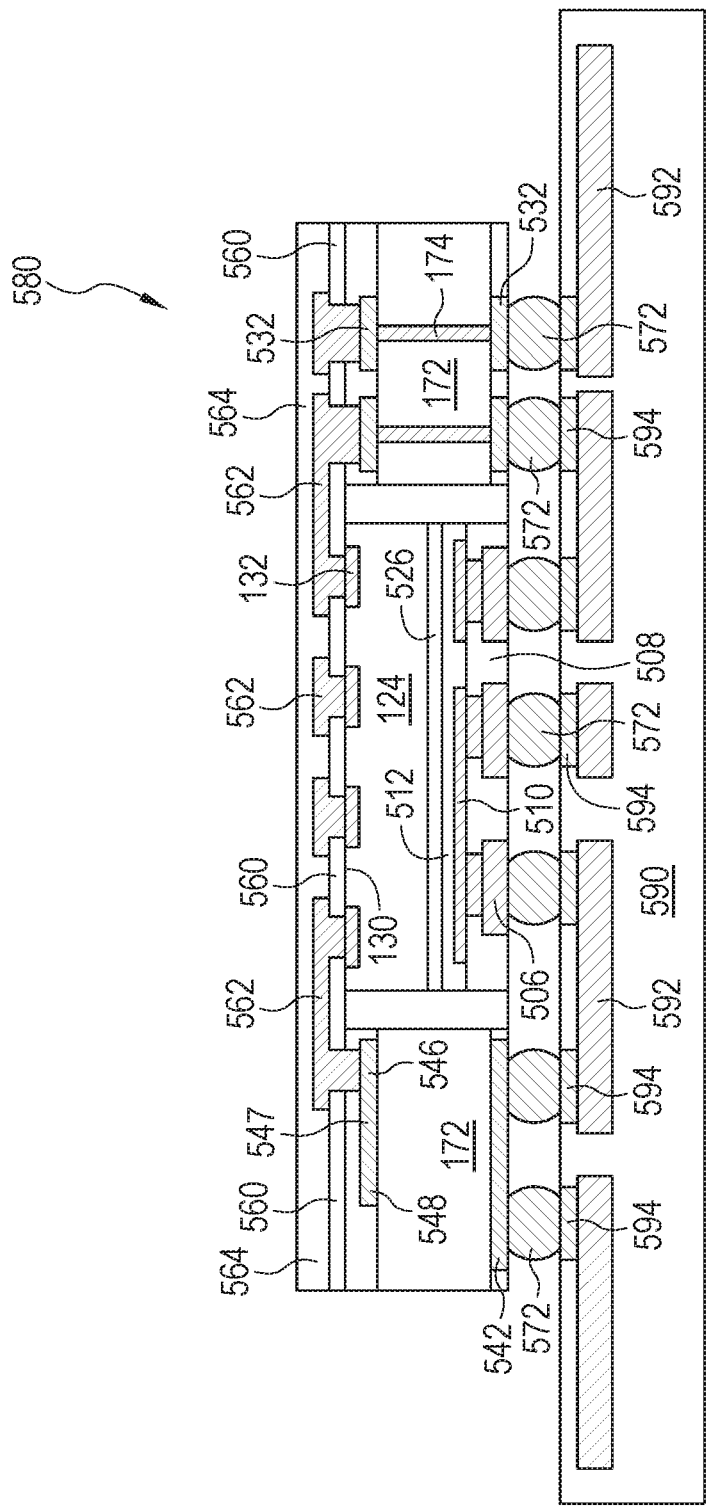

In FIG. 8i, a transceiver package 580 is disposed onto PCB, mother circuit board, or other substrate 590. Substrate 590 includes contact pads 594 and conductive traces 592. Conductive bumps 572 are reflowed to metallurgically and electrically couple package 580 to substrate 590. Conductive traces 592 electrically couple semiconductor die 124 to other circuit components disposed on substrate 590 through conductive layer 562 and conductive vias 174. Package 580 includes a self-defined antenna with the distance between antenna 548 and ground plane 542 defined by the thickness of PCB units 530 and 540.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant over the semiconductor die to form a reconstituted wafer;
    depositing a first conductive layer including an antenna onto a first surface of the reconstituted wafer after depositing the encapsulant; and
    depositing a second conductive layer including a ground plane onto a second surface of the reconstituted wafer after depositing the encapsulant, wherein the antenna is located within a footprint of the ground plane.

2. The method of claim 1, further including:
    disposing a dummy die on the semiconductor die; and
    depositing the encapsulant over the dummy die.

3. The method of claim 1, further including disposing a conductive via adjacent to the semiconductor die prior to depositing the encapsulant.

4. The method of claim 3, further including coupling the antenna to the semiconductor die through the conductive via.

5. The method of claim 3, further including forming the antenna with the conductive via between the antenna and semiconductor die.

6. The method of claim 1, further including:
    forming an insulating layer over the first surface of the reconstituted wafer; and
    forming a third conductive layer over the second surface of the reconstituted wafer with the insulating layer between the first conductive layer and third conductive layer.

7. A method of making a semiconductor device, comprising:
    providing a semiconductor die;
    disposing a PCB unit adjacent to the semiconductor die;
    depositing an encapsulant over the semiconductor die and PCB unit, wherein a first surface of the encapsulant, a first surface of the semiconductor die, and a first surface of the PCB unit are approximately coplanar;
    forming an antenna over the PCB unit; and
    forming a ground plane over the PCB unit, wherein at least one of the antenna or ground plane is formed over the first surface of the PCB unit, and at least one of the antenna or ground plane is formed over a second surface of the PCB unit opposite the first surface.

8. The method of claim 7, further including:
providing a dummy die;
forming a conductive layer on the dummy die; and
disposing the dummy die over the semiconductor die prior to depositing the encapsulant.

9. The method of claim 8, further including:
removing the dummy die by backgrinding the dummy die and encapsulant to expose the conductive layer;
forming a conductive bump on the conductive layer; and
disposing the semiconductor device over a substrate with the conductive layer coupled to the substrate by the conductive bump.

10. The method of claim 7, further including coupling the antenna to the semiconductor die through the PCB unit.

11. The method of claim 7, further including forming the ground plane and the antenna over the PCB unit prior to depositing the encapsulant.

12. The method of claim 7, further including coupling the ground plane to the semiconductor die through the PCB unit.

13. The method of claim 7, further including forming a conductive bump on the ground plane.

14. A semiconductor device, comprising:
a reconstituted wafer including,
a semiconductor die, and
an encapsulant deposited over the semiconductor die;
a first conductive layer including an antenna formed over a first surface of the reconstituted wafer; and
a second conductive layer including a ground plane formed over a second surface of the reconstituted wafer opposite the first surface.

15. The semiconductor device of claim 14, further including a conductive via extending through the encapsulant adjacent the semiconductor die.

16. The semiconductor device of claim 15, wherein the antenna is electrically coupled to the semiconductor die through the conductive via.

17. The semiconductor device of claim 14, further including a PCB unit disposed between the ground plane and the antenna.

18. The semiconductor device of claim 17, wherein the PCB unit includes a conductive via disposed between the antenna and semiconductor die.

19. The semiconductor device of claim 14, wherein an active surface of the semiconductor die is coplanar with the first surface of the reconstituted wafer.

20. The semiconductor device of claim 14, wherein an active surface of the semiconductor die is coplanar with the second surface of the reconstituted wafer.

21. A semiconductor device, comprising:
a semiconductor die;
an encapsulant deposited over the semiconductor die to form a reconstituted wafer;
an antenna formed over the reconstituted wafer; and
a ground plane formed over the reconstituted wafer opposite the antenna.

22. The semiconductor device of claim 21, further including a conductive bump formed over the ground plane.

23. The semiconductor device of claim 21, further including a plurality of conductive vias formed through the encapsulant surrounding the semiconductor die.

24. The semiconductor device of claim 21, further including a PCB unit disposed in the encapsulant.

25. The semiconductor device of claim 24, wherein the antenna is coupled to the semiconductor die through the PCB unit.

* * * * *